US012745388B2

(12) United States Patent
Lin et al.

(10) Patent No.: US 12,745,388 B2
(45) Date of Patent: Sep. 22, 2026

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu City (TW); Chia-En Huang, Xinfeng Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 19/246,932

(22) Filed: Jun. 24, 2025

(65) Prior Publication Data

US 2025/0324586 A1 Oct. 16, 2025

Related U.S. Application Data

(62) Division of application No. 17/586,480, filed on Jan. 27, 2022, now Pat. No. 12,369,316.
(Continued)

(51) Int. Cl.
*H10B 41/27* (2023.01)
*G11C 5/02* (2006.01)
(Continued)

(52) U.S. Cl.
CPC ............. *H10B 41/27* (2023.02); *G11C 5/025* (2013.01); *H10B 43/27* (2023.02); *H10W 90/00* (2026.01)

(58) Field of Classification Search
CPC ........ H10B 41/27; H10B 43/27; H10B 43/20; G11C 5/025; H10W 90/00
See application file for complete search history.

(56) References Cited

U.S. PATENT DOCUMENTS

| | | | | |
|---|---|---|---|---|
| 8,786,007 | B2 * | 7/2014 | Chae | H10B 43/20 438/266 |
| 9,449,987 | B1 * | 9/2016 | Miyata | H10B 43/10 |

(Continued)

OTHER PUBLICATIONS

Notice of Allowance on U.S. Appl. No. 17/586,480 dtd Mar. 25, 2025.

*Primary Examiner* — Jeff W Natalini
*Assistant Examiner* — Rose Keagy
(74) *Attorney, Agent, or Firm* — Foley & Lardner LLP

(57) ABSTRACT

A semiconductor device includes a first memory array which includes a first memory string including a plurality of first memory cells arranged in a vertical direction. The first memory array further includes a first conductive structure operatively coupled to the first memory string that extends through the first memory array in the vertical direction. The semiconductor device further includes a second memory array including a second memory string including a plurality of second memory cells arranged in the vertical direction. The second memory array further includes a second conductive structure operatively coupled to the second memory string that extends through the second memory array in the vertical direction. The semiconductor device further includes a bowl-shaped conductive structure interposed between the first and second memory arrays, and configured to operatively couple the first conductive structure to the second conductive structure.

20 Claims, 21 Drawing Sheets

Related U.S. Application Data

(60) Provisional application No. 63/220,191, filed on Jul. 9, 2021.

(51) Int. Cl.
*H10B 43/27* (2023.01)
*H10W 90/00* (2026.01)

(56) References Cited

U.S. PATENT DOCUMENTS

| | | | | |
|---|---|---|---|---|
| 10,483,280 | B1 * | 11/2019 | Xiao ...................... | H10B 43/27 |
| 10,553,599 | B1 * | 2/2020 | Chen ...................... | H10B 41/27 |
| 2015/0236038 | A1 | 8/2015 | Pachamuthu et al. | |
| 2020/0411509 | A1 | 12/2020 | Yang et al. | |
| 2022/0037362 | A1 | 2/2022 | Lin et al. | |
| 2022/0189984 | A1 | 6/2022 | Okina | |
| 2022/0352207 | A1 | 11/2022 | Huang et al. | |

* cited by examiner

SEMICONDUCTOR MEMORY DEVICES AND METHODS OF MANUFACTURING THEREOF

CROSS-REFERENCE TO RELATED APPLICATION

This application is a divisional of U.S. patent application Ser. No. 17/586,480, filed Jan. 27, 2022, which claims priority to and the benefit of U.S. Provisional Application No. 63/220,191, filed Jul. 9, 2021, each of which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
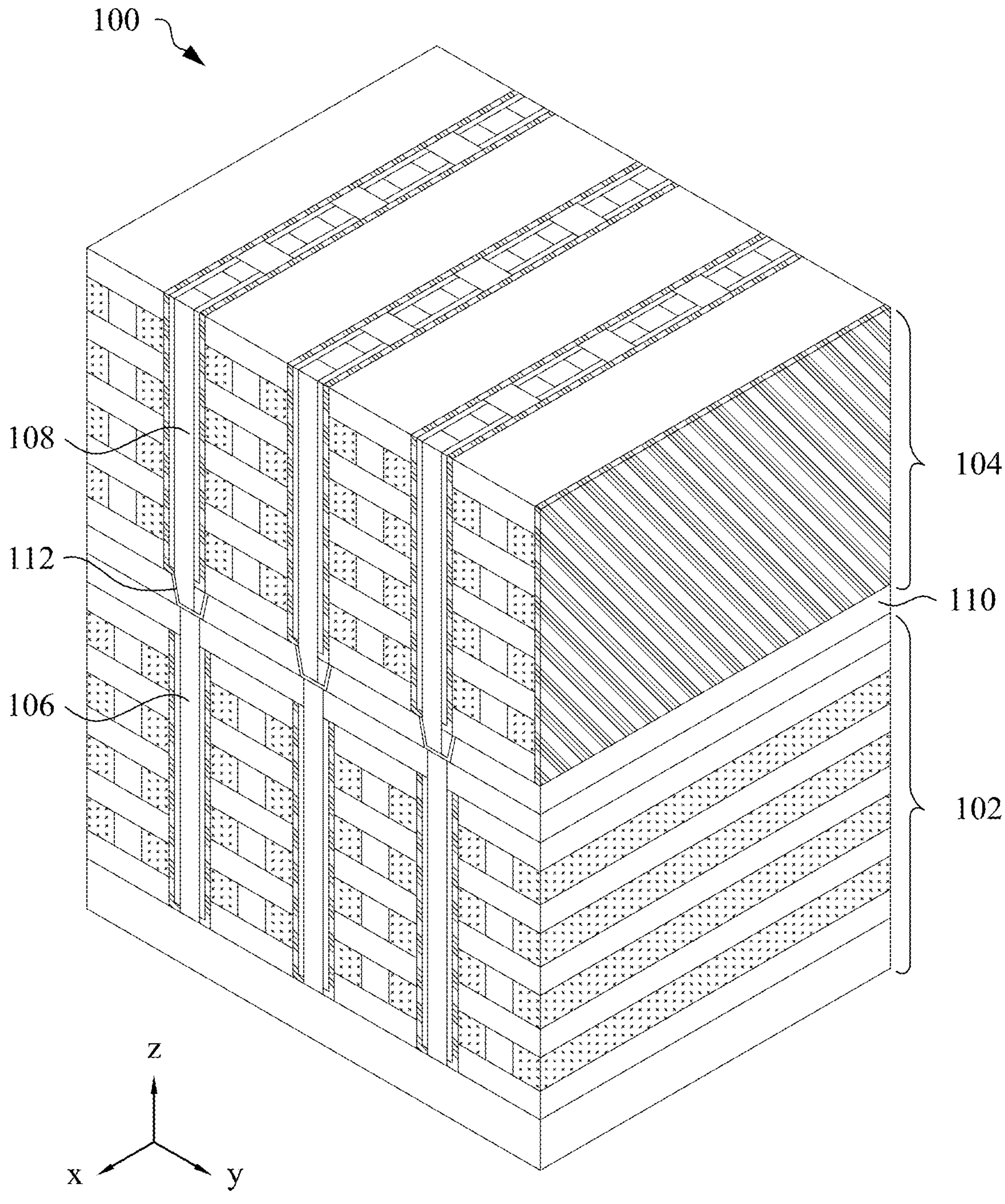
FIG. 1 illustrates a perspective view of a 3D memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a 3D memory device (sometimes referred to as a semiconductor device) includes a number of memory blocks. Each memory block includes at least one memory array (or sub-array) of memory cells formed in a stack of insulating layers and conductive layers. The memory cells are formed across multiple memory levels (or tiers) over a substrate and can include a group of first vertical conductive structures (each functioning as a source electrode of a number of memory cells arranged across the multiple memory levels) and a group of second vertical conductive structure (each functioning as a drain electrode of a number of memory cells arranged across the multiple memory levels). The drain electrode and source electrode may sometimes be referred to as "bit line (BL)," and "source/select line (SL)," respectively.

The 3D memory device can include two or more memory arrays stacked on top of each other for high-density applications, which saves memory chip areas. In general, when stacking a first memory array over a second memory array, their respective SLs and BLs should be aligned and electrically coupled to each other, allowing more memory arrays to be stacked and allowing all the stacked memory arrays to be operatively (e.g., electrically) coupled to one or more control circuits (e.g., drivers). However, when stacking the memory arrays, misalignment issues between the corresponding SLs and/or between the corresponding BLs may occur. Accordingly, the contact area between the SLs and/or between the BLs decreases, which in turn increases a contact resistance between the SLs and/or between the BLs. As such, a significant amount of signal drop (e.g., IR drop) may occur at these contacts, which can deteriorate performance (e.g., decrease of speed, increase of power consumption) of the memory device as a whole. Thus, the existing 3D memory device have not been entirely satisfactory in many aspects.

The present disclosure provides various embodiments of a 3D memory device having a number of bowl-shaped conductive structures between stacked memory arrays. The bowl-shaped conductive structures, formed of a metal material, are configured to electrically couple a number of vertically extending conductive structures (e.g., SLs and/or BLs) of one of the stacked memory arrays to a number of vertically extending conductive structures (e.g., SLs and/or BLs) of another of the stacked memory arrays, respectively. For example, the bowl-shaped conductive structure can have a base portion extending in a lateral plane, and sidewall portions extending from outer peripheral edges of the base portion. With such a bowl-shaped conductive structure interposed between the SLs/BLs of stacked memory arrays, even though misalignment between the stacked memory arrays occurs, the SLs/BLs of an upper one of the stacked memory arrays can have their full bottom surfaces remain in contact with the bowl-shaped conductive structure, which can eliminate the issues of decreased contact areas as identified in existing stacked memory arrays.

FIG. 1 illustrates a perspective view of a 3D memory device 100, in accordance with some embodiments. In some embodiments, the 3D memory device includes a first memory array 102 and a second memory array 104. The first memory array 102 and the second memory array 104 both include a plurality of memory strings that include a plurality of memory cells. The first memory array 102 may include a first plurality of vertical conductive structures 106, and the second memory array 104 may include a second plurality of vertical conductive structures 108. The second plurality of vertical conductive structures 108 may be vertically disposed above the first plurality of vertical conductive structures 106, although slightly misaligned. An intermetal dielectric (IMD) layer 110 may be formed between the first memory array 102 and the second memory array 104. A plurality of bowl-shaped conductive structures 112 may be formed in the IMD layer 110 and is configured to assure the second plurality of vertical conductive structures 108 to have their full bottom surfaces in (e.g., electrical) contact with the first plurality of vertical conductive structures 106 despite misalignment occurs between the memory arrays 102 and 104. Details of the first memory array 102, the second memory array 104, and the bowl-shaped conductive structure 112 will be discussed below.

Figure 2:
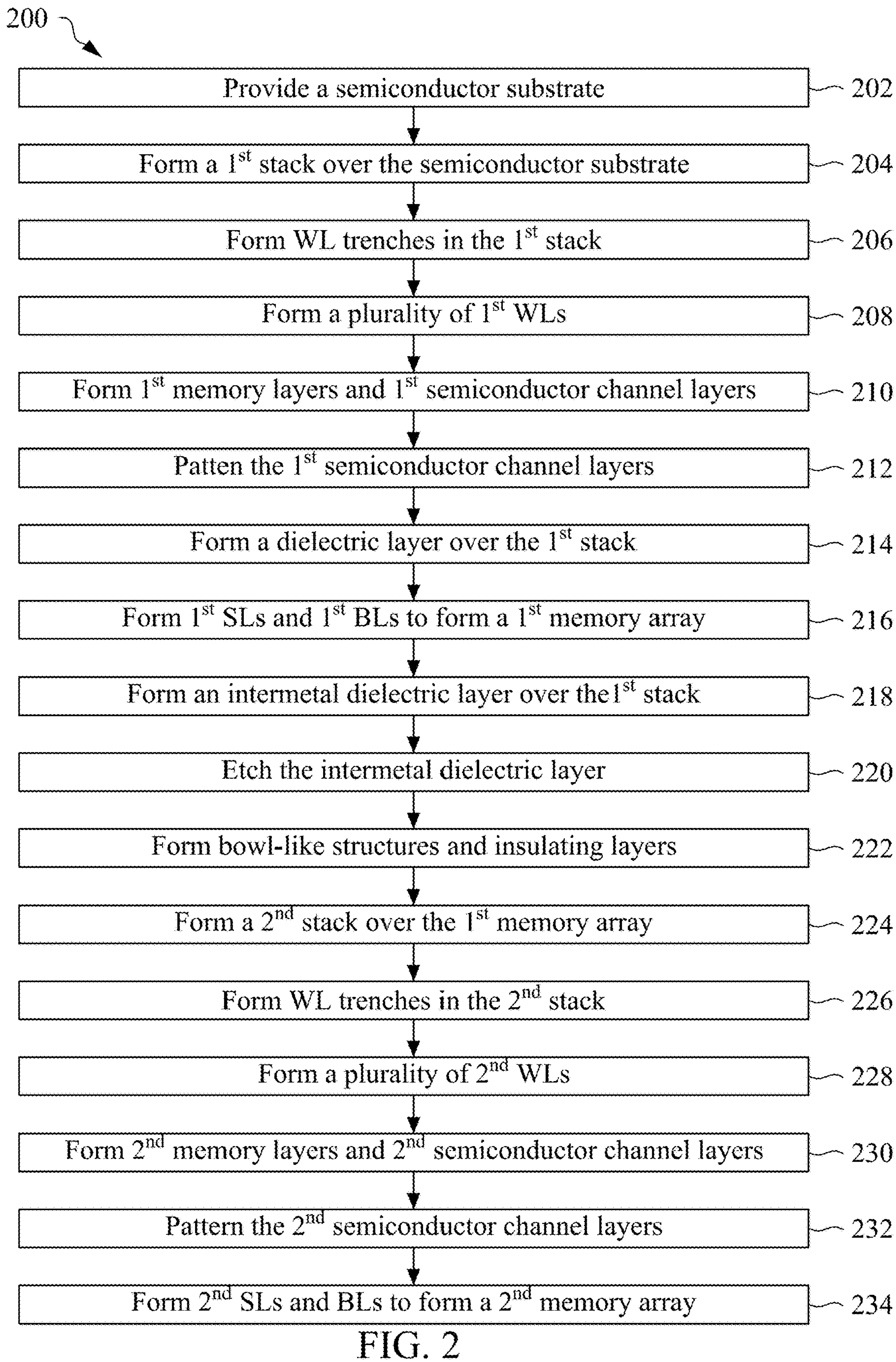
FIG. 2 is an example flow chart of a method for forming a 3D memory device, in accordance with some embodiments.

FIG. 2 illustrates a flowchart of an example method 200 for forming at least a portion of a 3D memory device 300 (e.g., the memory device 100 with respect to FIG. 1), in accordance with some embodiments. It should be noted that the method 200 is merely an example, and is not intended to limit the present disclosure. Accordingly, it is understood that the order of operation of the method 200 of FIG. 2 can change, that additional operations may be provided before, during, and after the method 200 of FIG. 2, and that some other operations may only be described briefly described herein.

In some embodiments, operations of the method 200 may be associated with perspective views of the example memory device 300 at various fabrication stages as shown in FIGS. 3, 4, 5, 6, 7, 8, 9, 10, 11, 12, 13, 14, and 15. In addition, the operations of the method 200 are equally applicable to any other memory device. Although FIGS. 3-15 illustrate the memory device 300 including a plurality of memory cells, it should be understood the memory device 300 may include a number of other devices such as inductors, fuses, capacitors, coils, etc., which are not shown in FIGS. 3-15, for purposes of clarity of illustration.

In a brief overview, the method 200 starts with the operation 202 in which a semiconductor substrate is provided. The method 200 continues to operation 204 in which a first stack is formed over the semiconductor substrate. The method 200 continues to operation 206 in which word line (WL) trenches are formed in the first stack. The method 200 continues to operation 208 in which a plurality of first word lines (WLs) are formed. The method 200 continues to operation 210 in which first memory layers and first semiconductor channel layers are formed. The method 200 continues to operation 212 in which the first semiconductor channel layers are patterned. The method 200 continues to operation 214 in which a dielectric layer is formed over the first stack. The method 200 continues to operation 216 in which first SLs and first BLs are formed to form a first memory array. The method 200 continues to operation 218 in which an intermetal dielectric layer is formed over the first stack. The method 200 continues to operation 220 in which the intermetal dielectric layer is etched. The method 200 continues to operation 222 in which the bowl-shaped conductive structures and insulating layers are formed. The method 200 continues to operation 224 in which a second stack is formed over the first memory array. The method 200 continues to operation 226 in which WL trenches are formed in the second stack. The method 200 continues to operation 228 in which a plurality of second WLs are formed. The method 200 continues to operation 230 in which second memory layers and second semiconductor channel layers are formed. The method 200 continues to operation 232 in which the second semiconductor channel layers are patterned. The method 200 continues to operation 234 in which second SLs and second BLs are formed to form a second memory array.

Figure 3:
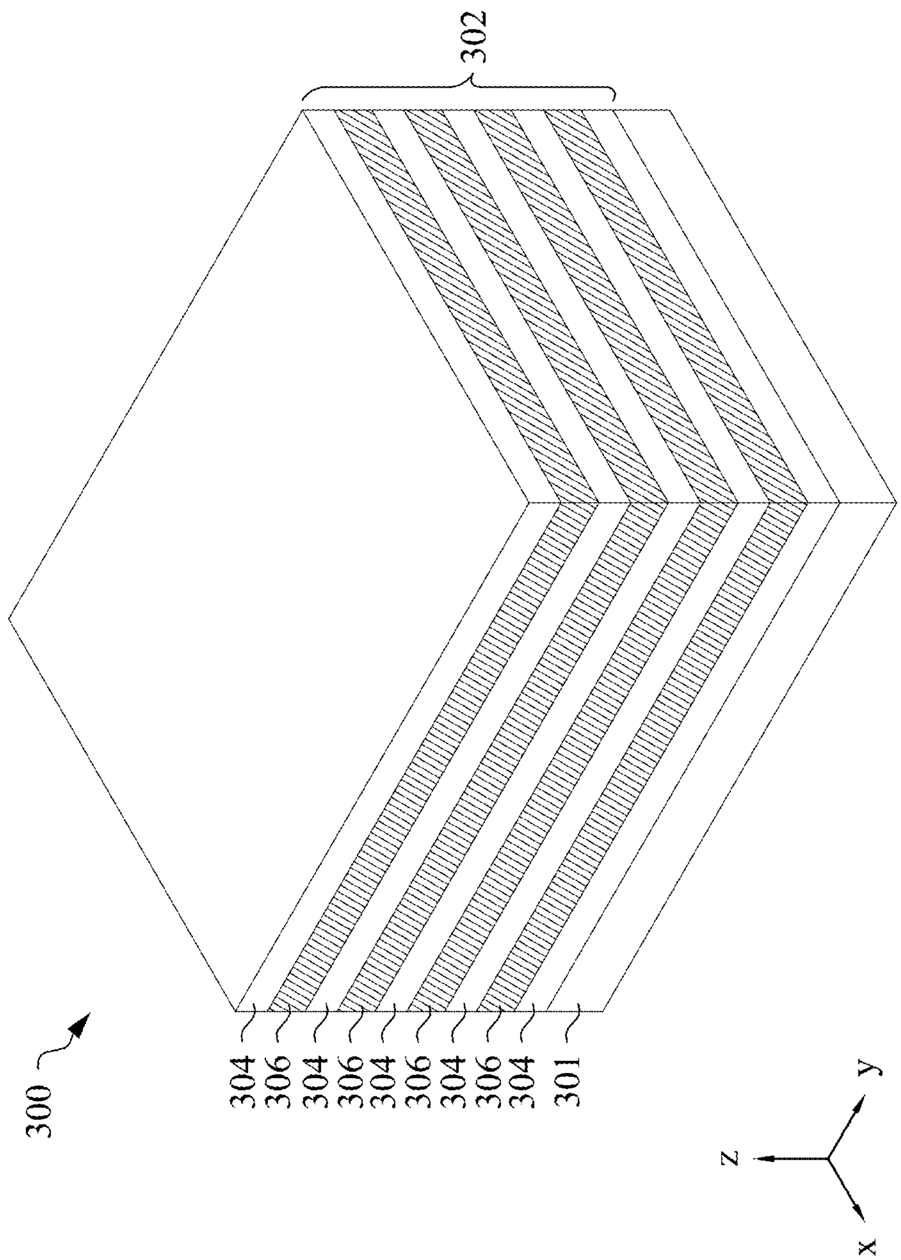
FIGS. 3, 4, 5, 6, 7, 8, 9, 10, 11, 12, 13, 14, and 15 illustrate perspective views of an example 3D memory device (or a portion of the example 3D memory device) during various fabrication stages, made by the method of FIG. 2, in accordance with some embodiments.

Corresponding to operations 202 and 204 of FIG. 2, FIG. 3 is a perspective view of a 3D memory device 300 including a first stack 302 formed over a semiconductor substrate 301, in accordance with some embodiments.

The semiconductor substrate 301 may be a semiconductor substrate, such as a bulk semiconductor, a semiconductor-on-insulator (SOI) substrate, or the like, which may be doped (e.g., with a p-type or an n-type dopant) or undoped. The substrate 301 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 301 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, a number of components may be formed over the semiconductor substrate 301 such as, but not limited to, transistors, metallization layers, via layers, or any other suitable component. The number of components may be disposed between the semiconductor substrate 301 and the first stack 302. Other materials are within the scope of the present disclosure. For example, the substrate 301 may include an insulating material (e.g., silicon nitride (SiN)) that function as an etch stop layer disposed over a semiconductor substrate.

The first stack 302 is formed above the semiconductor substrate 301 and includes a number of first insulating layers 304 and a number of first sacrificial layers 306 alternately stacked on top of one another over the substrate 301 along a vertical direction (e.g., the Z direction). Although five first insulating layers 304 and four first sacrificial layers 306 are shown in the illustrated embodiment of FIG. 3, it should be understood that the first stack 302 can include any number of first insulating layers and any number of first sacrificial layers alternately disposed on top of one another, while remaining within the scope of the present disclosure. Further, although the first stack 302 directly contacts the substrate 301 in the illustrated embodiment of FIG. 3, it should be understood that the first stack 302 may be separated from the substrate 301. As used herein, the alternately stacked first insulating layers 304 and first sacrificial layers 306 refer to each of the first sacrificial layers 306 being adjoined by two adjacent first insulating layers 304. The first insulating layers 304 may have the same thickness thereamongst, or may have different thicknesses. The first sacrificial layers 306 may have the same thickness thereamongst, or may have different thicknesses. In some embodiments, the first stack 302 may begin with the first insulating layer 304 (as shown in FIG. 3) or the first sacrificial layer 306.

The first insulating layers 304 can include at least one insulating material. The insulating materials that can be employed for the first insulating layer 304 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first insulating layers 304 can be silicon oxide.

The first sacrificial layers 306 may include an insulating material, a semiconductor material, or a conductive material. The material of the first sacrificial layers 306 is a sacrificial material that can be subsequently removed selective to the material of the first insulating layers 304. Non-limiting examples of the first sacrificial layers 306 include silicon nitride, an amorphous semiconductor material (such as amorphous silicon), and a polycrystalline semiconductor material (such as polysilicon). In one embodiment, the first sacrificial layers 306 can be spacer material layers that include silicon nitride or a semiconductor material including at least one of silicon or germanium.

The first stack 302 can be formed by alternately depositing the respective materials of the first insulating layers 304 and first sacrificial layers 306 over the substrate 301. In some embodiments, one of the first insulating layers 304 can be deposited, for example, by chemical vapor deposition (CVD), followed by depositing, for example, using CVD or atomic layer deposition (ALD), one of the sacrificial layers 306.

Figure 4:
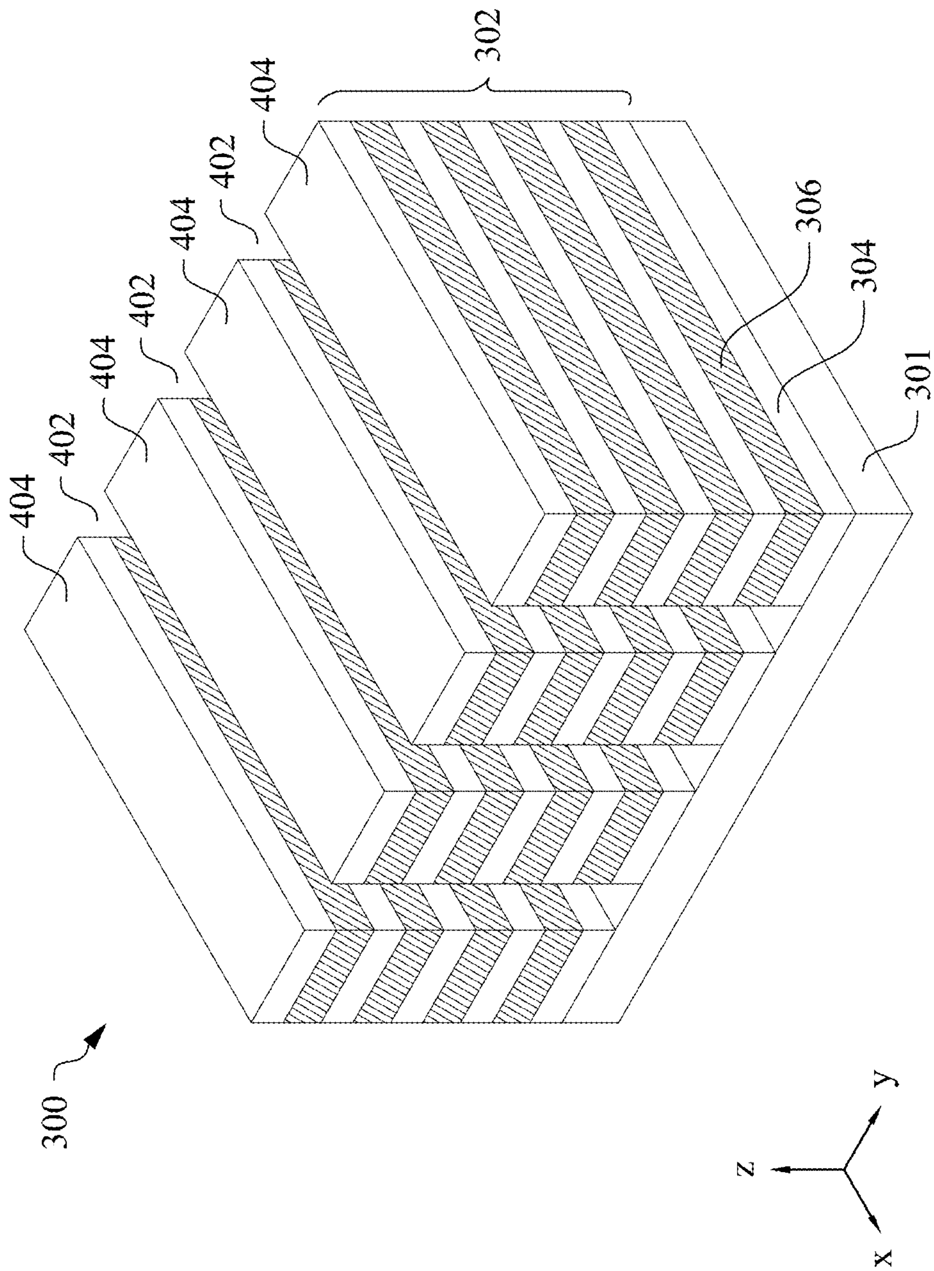

Corresponding to operation 206 of FIG. 2, FIG. 4 is a perspective view of the 3D memory device 300 including a plurality of first WL trenches 402 at one of the various stages of fabrication, in accordance with various embodiments.

Although three first WL trenches 402 are shown in the illustrated embodiment of FIG. 4, it should be understood that the 3D memory device 300 can include any number of first WL trenches, while remaining within the scope of the present disclosure. The first WL trenches 402 extend along a lateral direction (e.g., the X direction). The first WL trenches 402 can be formed using one or more etching processes. The etching processes may each include, for example, a reactive ion etch (RIE) process, a neutral beam etch (NBE) process, the like, or combinations thereof. The etching processes may be anisotropic.

As a result of forming the first WL trenches 402, first fin-like structures 404 are formed. As shown, the first fin-like structures 404 (sometimes referred to as stripe structures) all extend along a lateral direction (e.g., the X direction), and are in parallel with one another. Each of the first fin-like structures 404 includes a number of layers (or tiers) alternately stacked on top of one another. In particular, each first fin-like structure includes an alternate stack of a number of (remaining portions of) the first insulating layers 304 and a number of (remaining portions of) the first sacrificial layers 306.

Figure 5:
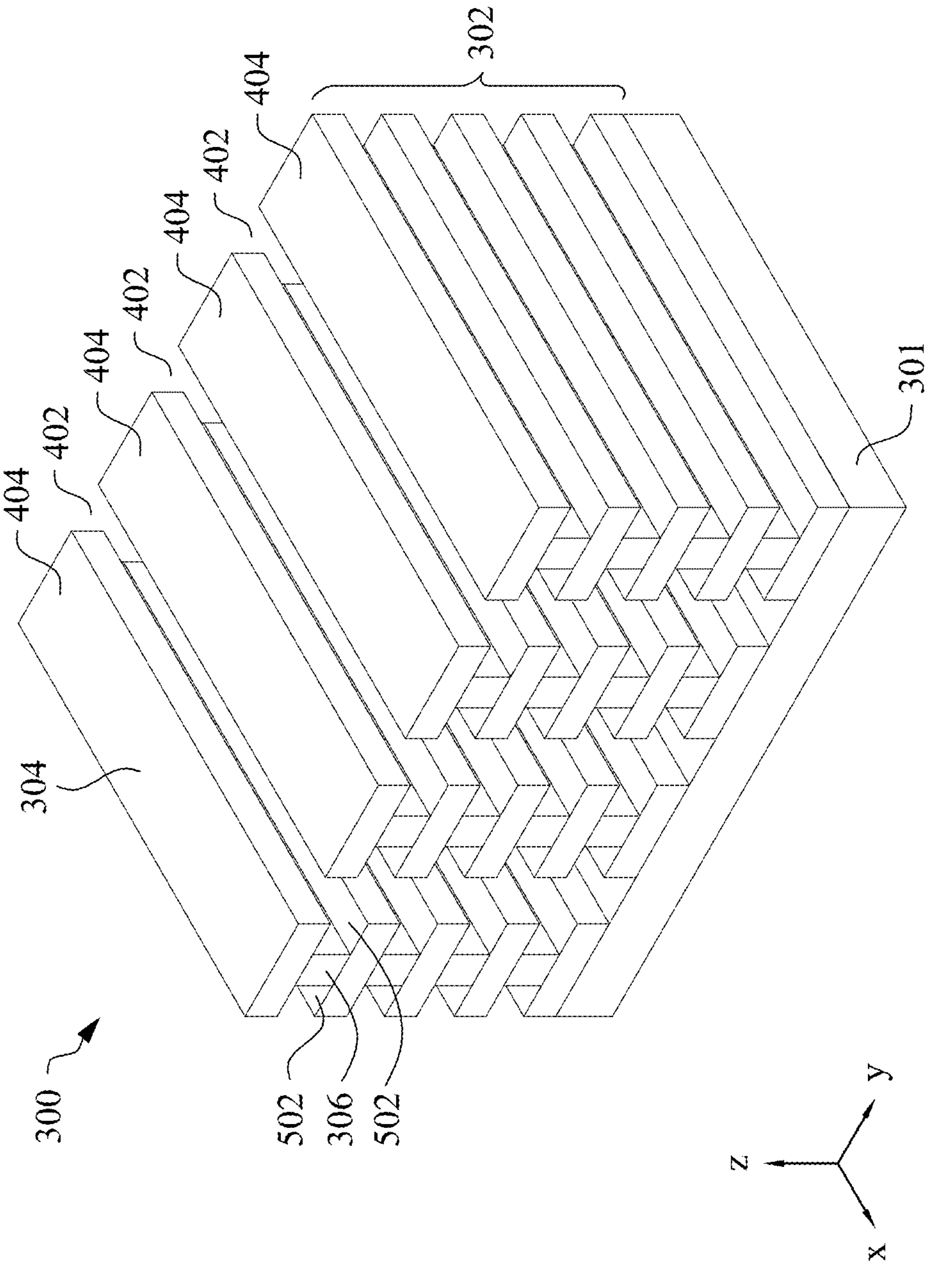

Corresponding to operation 208 of FIG. 2, FIG. 5 is a perspective view of the 3D memory device 300 including a number of first cavities 502 at one of the various stages of fabrication, in accordance with various embodiments.

To form first WLs (functioning as gate layers or gate electrodes), respective end portions of each of the first sacrificial layers 306 in each of the first fin-like structures 404 may be laterally recessed (e.g., along the Y direction) to form first cavities 502. The first sacrificial layers 306 can be recessed by performing an etching process that etches the first sacrificial layers 306 selective to the first insulating layers 304 through the first WL trenches 402. Alternatively stated, the insulating layers 304 may remain substantially intact throughout the selective etching process. In some embodiments, each of the first sacrificial layers 306 may be inwardly recessed from its both ends (along the Y direction) with a certain etch-back distance. Such an etch-back distance can be controlled to be less than one half the width of the first sacrificial layer 306 along the Y direction, so as to remain a central portion of the first sacrificial layers 306 intact, as shown in FIG. 5.

The etching process can include a wet etching process employing a wet etch solution, or can be a gas phase (dry) etching process in which the etchant is introduced in a vapor phase into the first WL trenches (dotted lines). In the example where the first sacrificial layers 306 include silicon nitride and the first insulating layers 304 include silicon oxide, the etching process can include a wet etching process in which the workpiece is immersed within a wet etch tank that includes phosphoric acid, which etches silicon nitride of the first sacrificial layer 306 selective to silicon oxide, silicon, and various other materials of the first insulating layers 304.

Figure 6:
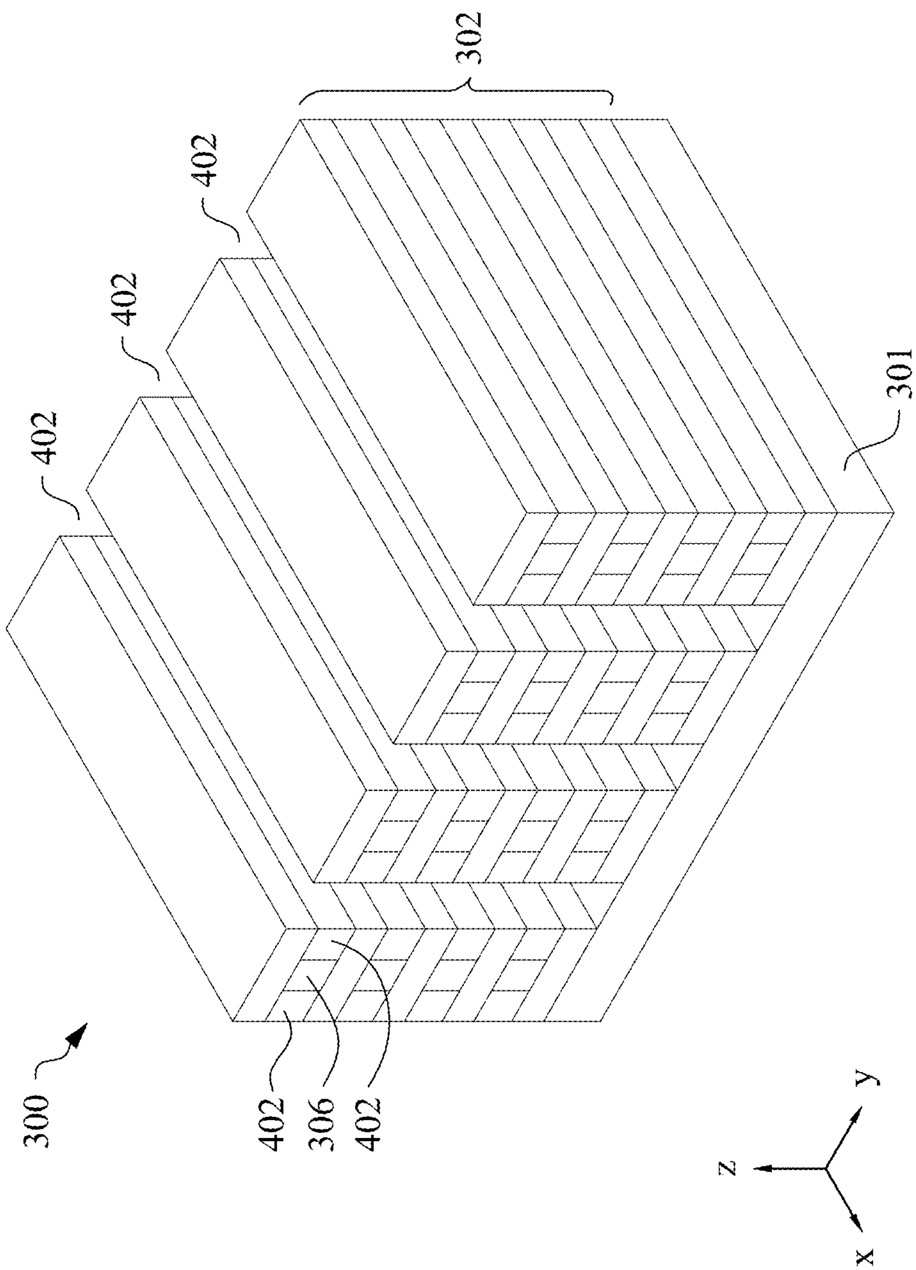

Also corresponding to operation 208 of FIG. 2, FIG. 6 is a perspective view of the 3D memory device 300 including a plurality of first WLs 602 (sometimes referred to as conductive structures) at one of the various stages of fabrication, in accordance with various embodiments.

A metallic fill layer can be (e.g., conformally) formed to fill the first cavities 502 (FIG. 5) inwardly extending toward the remaining first sacrificial layers 306 with respect to the first insulating layer 304, thereby forming the first WLs 602, as shown in FIG. 6. The metallic fill layer includes at least one metal material selected from the group consisting of tungsten, copper, cobalt, ruthenium, titanium, tantalum, or combinations thereof. The metallic fill layer can be deposited by a conformal deposition method, which can be, for example, chemical vapor deposition (CVD), atomic layer deposition (ALD), electroless plating, electroplating, or a combination thereof.

Figure 7:
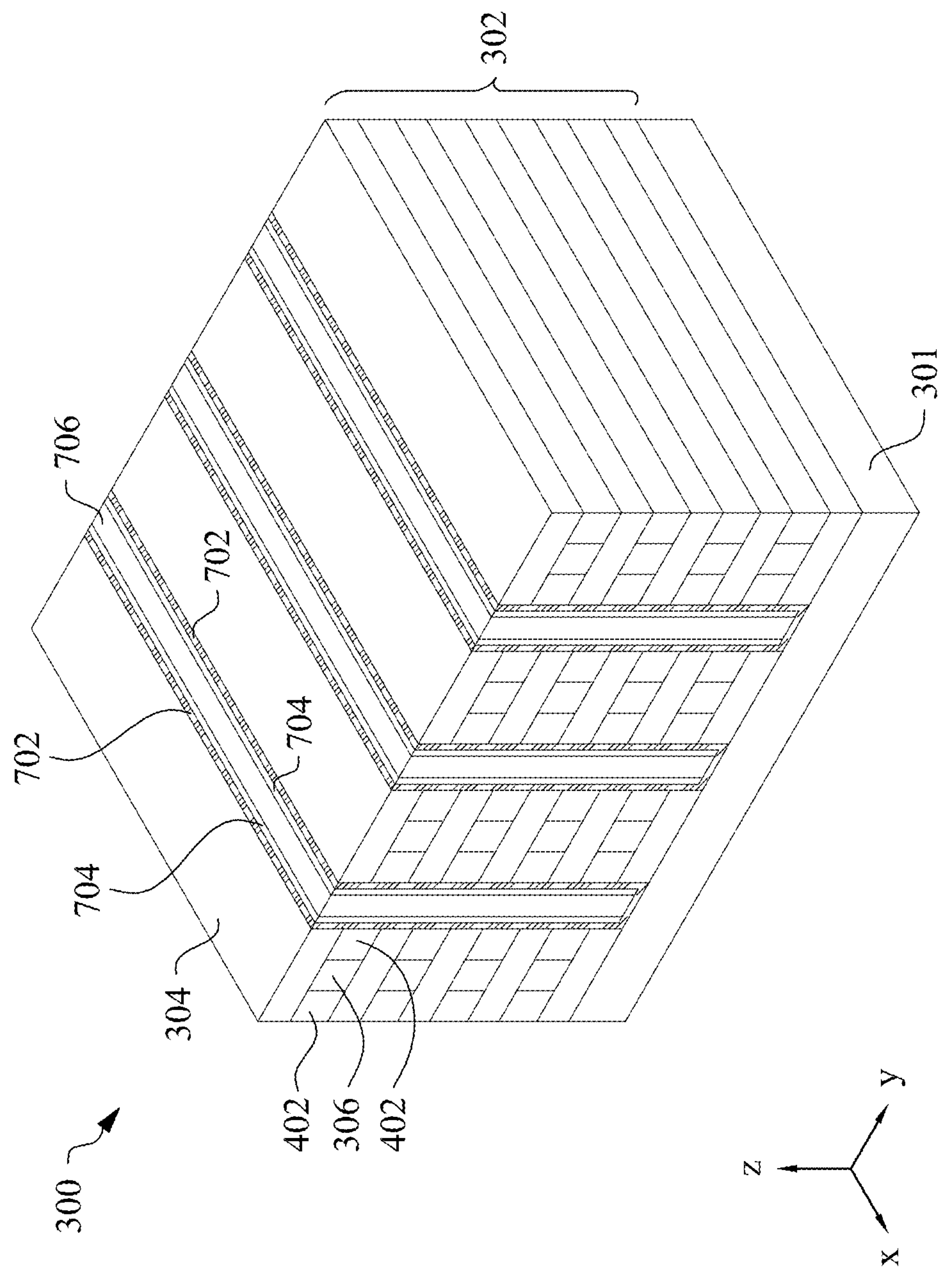

Corresponding to operation 210 of FIG. 2, FIG. 7 is a perspective view of the 3D memory device 300 including a plurality of first memory layers 702 and a plurality of first channel layers 704 at one of the various stages of fabrication, in accordance with various embodiments.

In various embodiments, each of the first memory layers 702 includes two portions, each of which is formed to extend along one of the sidewalls of a corresponding trench. As such, each portion of the first memory layer is in contact with a corresponding number of first WLs (through their respective exposed sidewalls). Over the memory layer, each of the first channel layers 704 also includes two portions that are in contact with the two portions of a corresponding first memory layer, respectively. As shown in the illustrated example of FIG. 7, the first memory layers 702, and the first channel layers 704, including two portions, are formed in the first trenches 402 (FIG. 6).

Each of the first memory layers 702, disposed along sidewalls of each of the first WL trenches 402 (FIG. 6), may include a ferroelectric material, for example, lead zirconate titanate (PZT), $PbZr/TiO_3$, $BaTiO_3$, $PbTiO_2$, etc. However, it should be understood that the first memory layers 702 may each include a charge storage layer, while remaining within the scope of the present disclosure. The first memory layers 702 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the first memory layers are each continuous around the sidewalls of the first WL trenches 402 (FIG. 6). In some embodiments, a conformal coating may be deposited such that the first memory layers 702 are each continuous around the sidewalls and the bottom portion of the first WL trenches 402 (FIG. 6), as shown in FIG. 7. In such embodiments, the bottom portion of the first memory layers 702 may be etched to form two portions of each first memory layer 702.

Each of the first channel layers 704 is formed on inner surfaces (sidewalls) of the first memory layer 702. In some embodiments, the first channel layers 704 may each be formed from a semiconductor material, for example, Si (e.g., polysilicon or amorphous silicon), Ge, SiGe, silicon carbide (SiC), etc. The first channel layers 704 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the first channel layers 704 are each continuous on the inner surfaces of the first memory layer 702.

Each of the first WL trenches 402 (FIG. 6) is then filled with an insulating material (e.g., SiO, SiN, SiON, SiCN, SiC, SiOC, SiOCN, the like, or combinations thereof) so as to form the first inner spacers 706. In some embodiments, the first inner spacer 706 may be formed from the same material as the plurality of first insulating layers 304. The first inner spacers 706 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 8:
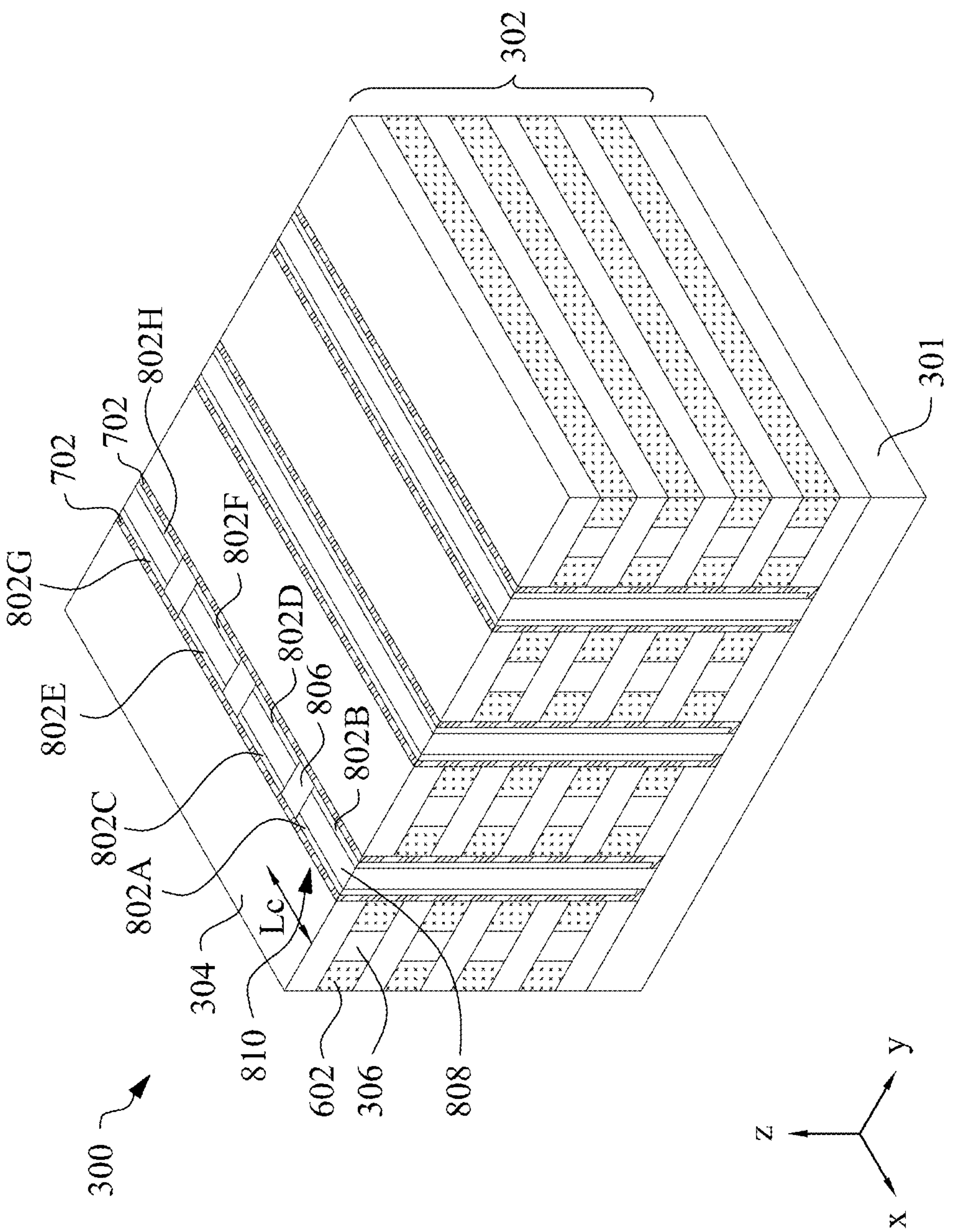

Corresponding to operation 212 of FIG. 2, FIG. 8 is a perspective view of the 3D memory device 300 in which the first channel layers 704 are each patterned at one of the various stages of fabrication, in accordance with various embodiments.

In some embodiments, each of the first channel layers 704 is patterned into a number of segments, each of which can define the initial footprint of a memory string. For example, the channel layer 704 is patterned into discrete segments 802A, 802B, 802C, 802D, 802E, 802F, 802G, and 802H. Each of such channel segments form first channel films and can serve as the channel of a memory string that includes a number of memory cells disposed across multiple tiers. As shown in FIG. 8, each of the first channel films 802A-H may extend along the X-direction with a length ($L_C$), which may be configured to define the physical channel length of a memory cell. Each channel film defines the initial footprint of a memory string. Thus, a plurality of partially-formed first memory cells 810 that include the first memory layers 702, and the first channel films 802A-H are formed in the memory device 300, and extend in the X-direction parallel to each other.

The first isolation structures 806 are formed to separate the first semiconductor channel films 802A-H into portions such that the first semiconductor channel films 802A-H are included in each partially-formed first memory cell 810 and fill any cavities formed from the patterning. Each partially-formed first memory cell 810 includes a first inner spacer 808 formed from a portion of the insulation layer extending between adjacent first isolation structures 806 in the X-direction, in accordance with some embodiments. The first semiconductor channel films 802A-H are disposed on outer surfaces of the first inner spacers 808 in the Y-direction.

Figure 9:
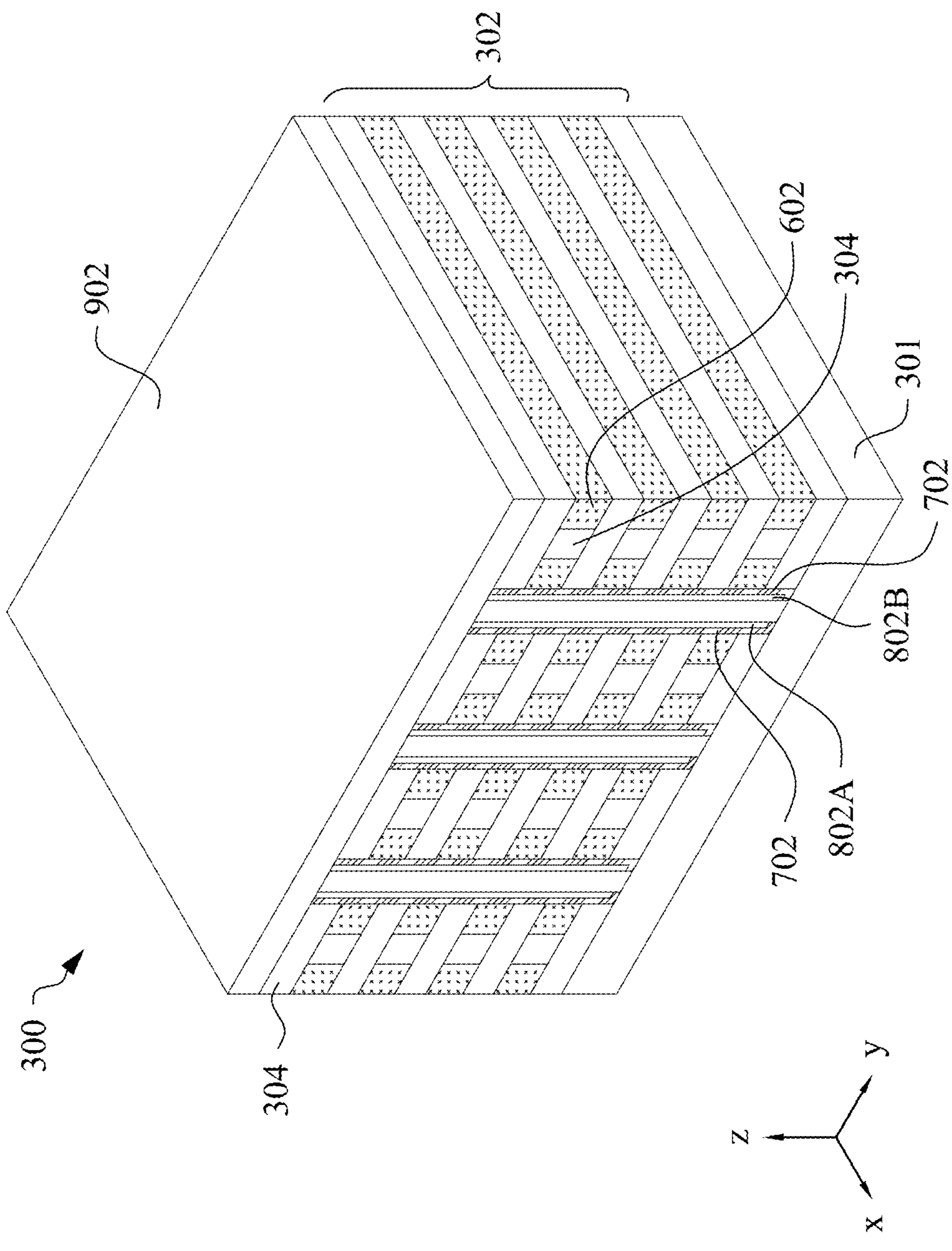

Corresponding to operation 214 of FIG. 2, FIG. 9 is a perspective view of the 3D memory device 300 including a dielectric layer 902 at one of the various stages of fabrication, in accordance with some embodiments.

The dielectric layer 902 may be formed over the first stack 302. The dielectric layer 902 may be, for example, silicon oxide, silicon nitride, silicon oxynitride, silicon carbide, silicon carbonitride, silicon oxycarbonitride, silicon oxycarbide, multilayers thereof, or any other suitable material and may be deposited or thermally grown. The dielectric layer 902 may be substantially planar on and extending along both the X-direction and the Y-direction. The dielectric layer 902 may be the same thickness or a different thickness from the first insulating layers 304 or the first sacrificial layers 306.

Figure 10:
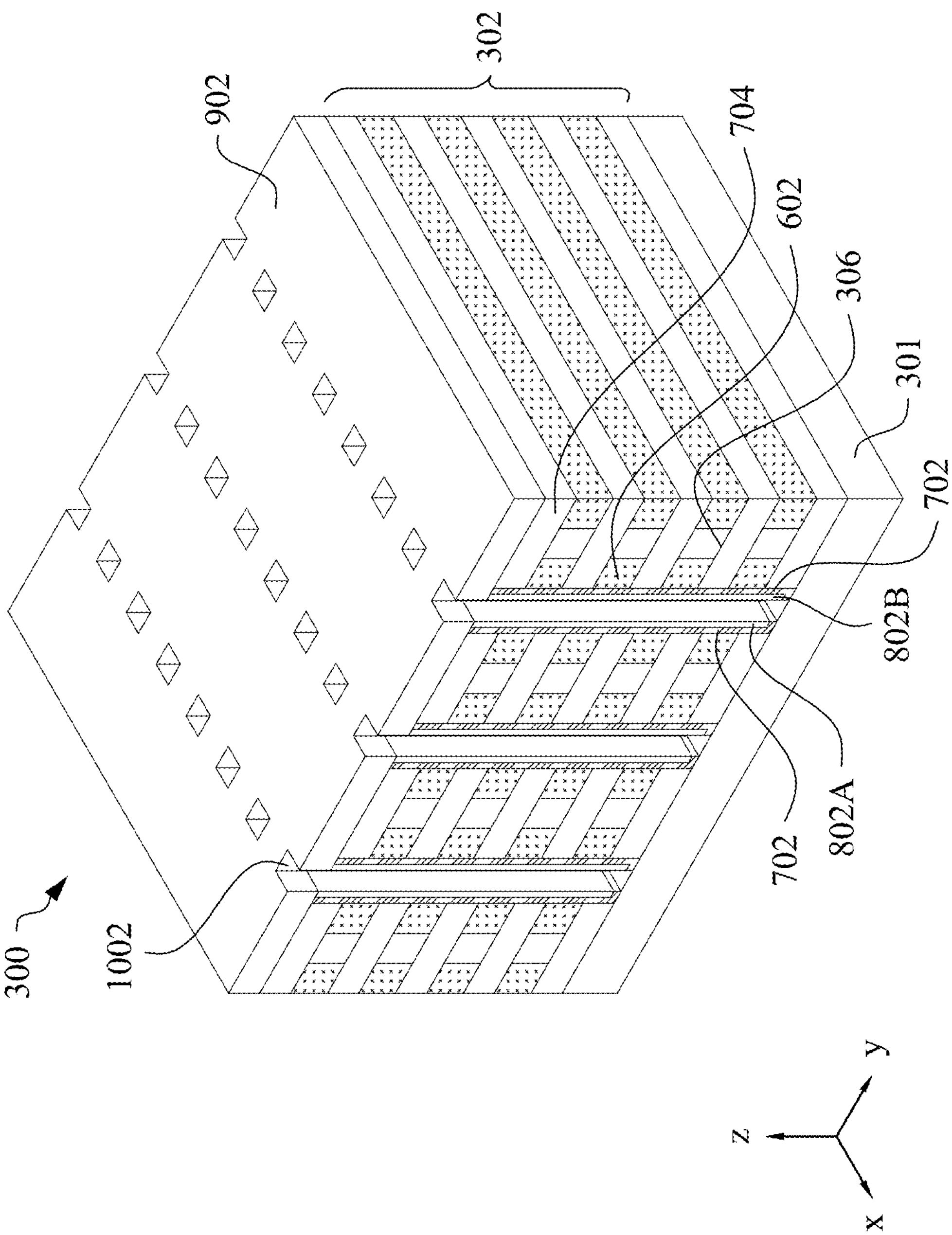

Corresponding to operation 216 of FIG. 2, FIG. 10 is a perspective view of the 3D memory device 300 including a number of first vertical cavities 1002 used to form SLs and BLs (sometimes referred to as conductive structures), at one of the various stages of fabrication, in accordance with some embodiments.

The dielectric layer 902 and the first inner spacers 808 (FIG. 8) may be patterned to define first vertical cavities 1002 of a number of first SLs and first BLs. A mask layer may be overlaid on the dielectric layer 902 for the patterning. The patterning generates trench portions by first etching through axial ends of the first inner spacers 808 and the dielectric layer 902 to the substrate 301. The axial ends of the first inner spacers 808 and the dielectric layer 902 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 11:
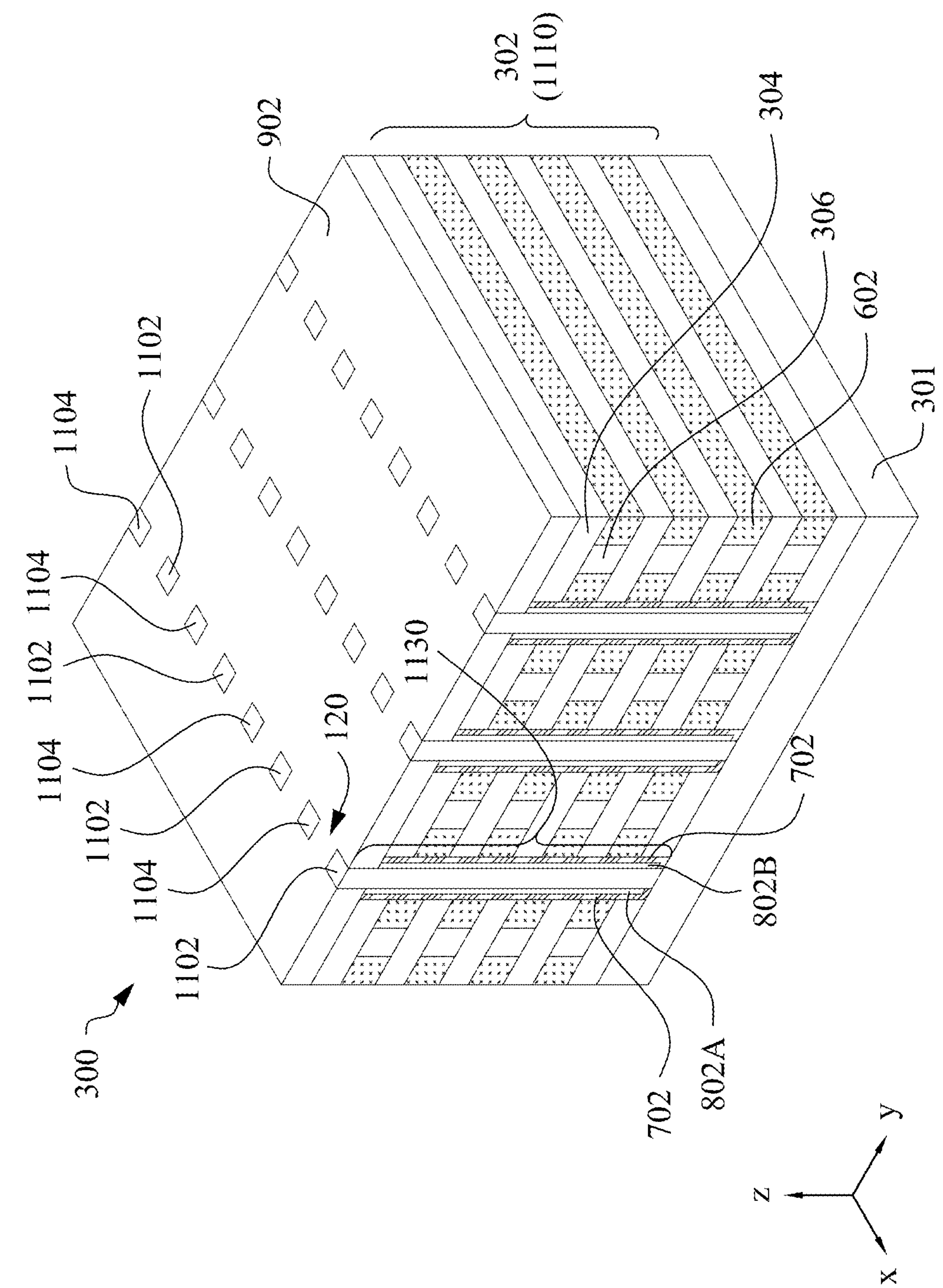

Also corresponding to operation 216 of FIG. 2, FIG. 11 illustrates a perspective view of the 3D memory device 300 in which a plurality of first SLs 1102 and a plurality of first BLs 1104 are formed, in accordance with various embodiments. The first SLs 1102 and the first BLs 1104 extend vertically along the Z-direction and are spaced apart from each other in the X-direction. In some embodiments, a SL or BL may sometimes be referred to as an access line and/or a conductive structure. However, it should be understood that, in some embodiments, the SLs and the BLs may be coupled to different levels of (e.g., voltage) signals, when operating the memory device.

The first SLs 1102 and the first BLs 1104 may then be formed, for example, using an epitaxial layer growth process to fill the trench portions with a continuously formed metal material such that the first SLs 1102 and the first BLs 1104 are located in the first vertical cavities 1002 (FIG. 10), each extending from the substrate 301 to a top surface of the dielectric layer 902, as shown in FIG. 11. The first SLs 1102 and the first BLs 1104 may be formed in contact with end portions of a sidewall of the first semiconductor channel films 802A-H. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the first SLs 1102 and the first BLs 1104 may be formed with a continuously formed semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The first SLs 1102 and first BLs 1104 can be formed by overlaying the workpiece (e.g., to fill the recesses) with the above-listed material by, for example, chemical vapor deposition (CVD), physical vapor deposition (PVD), electroless plating, electroplating, any other suitable material, or combinations thereof. In some embodiments, a control deposition step may be performed for forming the first SLs 1102 and the first BLs 1104 such that the deposition step is stopped when a height of the first SLs 1102 and the first BLs 1104 in the Z-direction are equal to a height of the first stack 302 and the dielectric layer 902. In other embodiments, a CMP operation may be performed after formation of the first SLs 1102 and the first BLs 1104 so as to ensure a top surface of the dielectric layer 902, the first SLs 1102, and the first BLs 1104 lie in the same X-Y plane or are level with a top surface of the dielectric layer 902. In other embodiments, a top surface of the first SLs 1102 and the first BLs 1104 may be higher than a top surface of the dielectric layer 902. In some other embodiments, the top surface of the first SLs 1102 and the first BLs 1104 may be lower than the top surface of the dielectric layer 902.

Upon forming the first SLs 1102 and first BLs 1104, a number of first memory cells 1120 may be formed (or otherwise defined), in accordance with various embodiments. Each of the first SLs 1102 and each of the first BLs 1104 are in contact with a respective one of the plurality of first semiconductor channel films 802A-H. Each of the first semiconductor channel films 802A-H is (e.g., electrically) coupled to a portion of each of the first WLs 602. Each first memory cell 1120 may be defined by such a portion of one of the first WLs 602 (which can function as its gate terminal), a portion of one of the first semiconductor channel films 802A-H, a portion of one of the first memory layers 702, one of the first SLs 1102 (which can function as its source terminal), and one of the first BLs 1104 (which can function as its drain terminal). These first memory cells 1120, which share the same pair of first SL and BL (and the same first semiconductor channel film), may be vertically separated from one another to form a memory string 1130. Alternatively stated, these memory cells of a single memory string are disposed in respective different memory levels. As such, the memory cells of such a memory string have their respective gate terminals (WLs) disposed in those different memory levels. In addition, a plurality of these memory strings can be laterally disposed with respect to one another to form a first memory block or a first memory array 1110.

Figure 12:
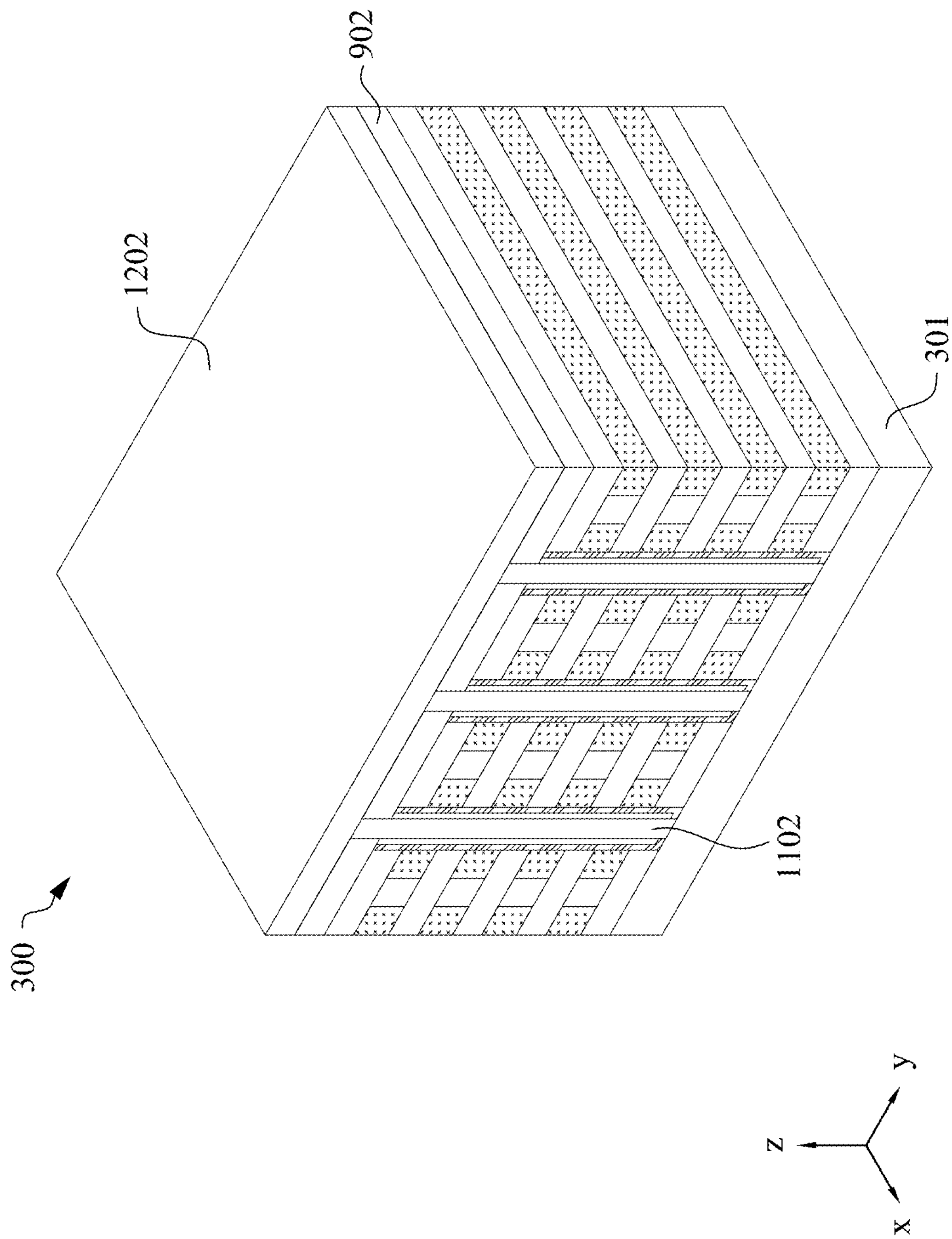

Corresponding to operation 218 of FIG. 2, FIG. 12 is a perspective view of the 3D memory device 300 including an intermetal dielectric (IMD) layer 1202, at one of the various stages of fabrication, in accordance with some embodiments.

The IMD layer 1202 may be formed over the dielectric layer 902, the first SLs 1102, and the first BLs 1104. The IMD layer 1202 may be substantially planar. The IMD layer 1202 may be formed of a dielectric material. The dielectric material includes silicon oxide, phosphosilicate glass (PSG), borosilicate glass (BSG), boron-doped phosphosilicate Glass (BPSG), undoped silicate glass (USG), any other suitable material, or the like. The IMD layer 1202 can be deposited by a conformal deposition method, which can be, for example, chemical vapor deposition (CVD), atomic layer deposition (ALD), electroless plating, electroplating, any other suitable method, or a combination thereof.

Figure 13:
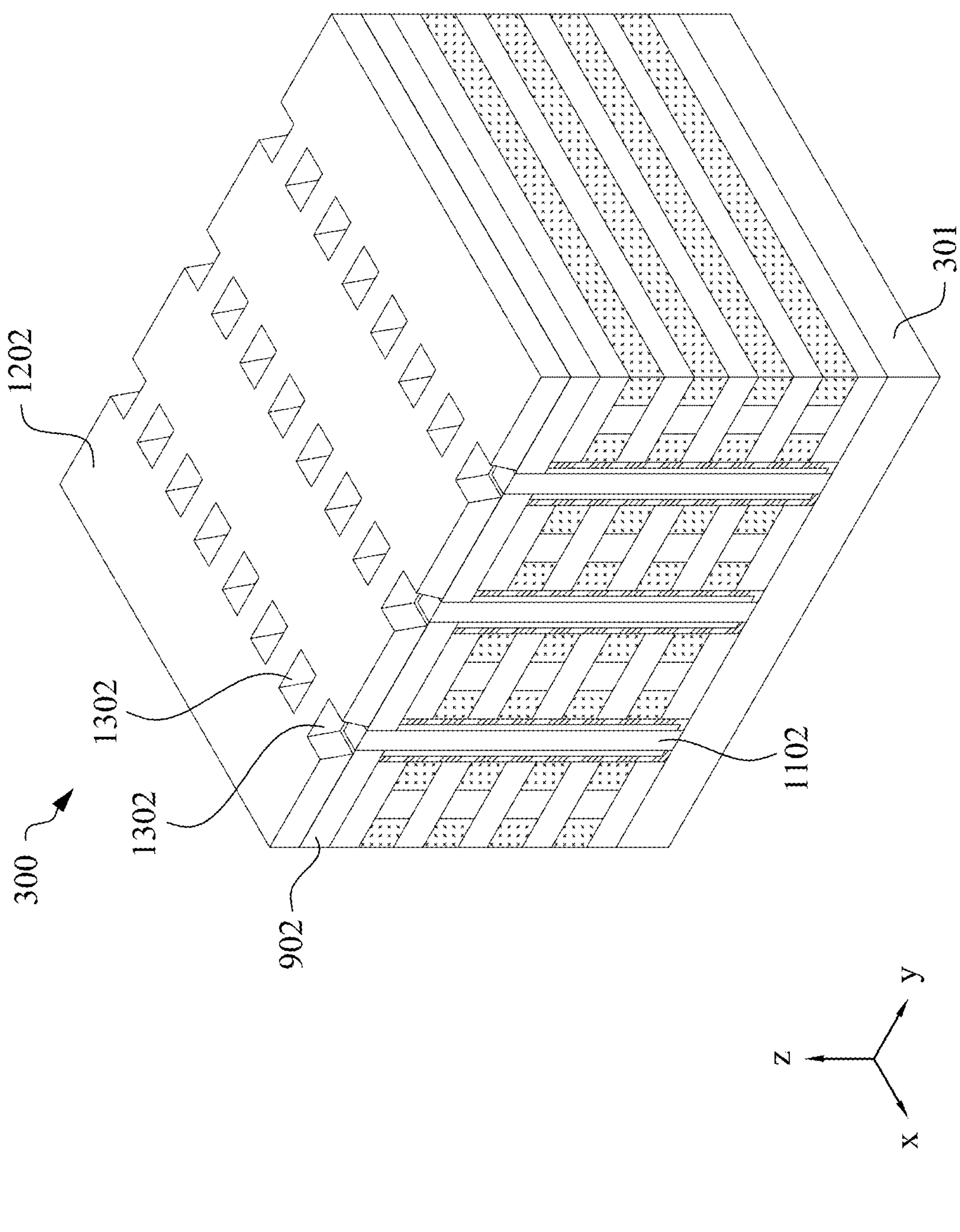

Corresponding to operation 220 of FIG. 2, FIG. 13 is a perspective view of the 3D memory device 300 including a plurality of IMD cavities 1302 in the IMD layer 1202, at one of the various stages of fabrication, in accordance with some embodiments.

The IMD layer 1202 may then be etched to form the plurality of IMD cavities 1302 in order to form the bowl-shaped conductive structures that will be further discussed below. A mask layer may be deposited over the IMD layer 1202 in order to pattern the plurality of IMD cavities 1302. The IMD cavities 1302 are formed to expose the top surfaces of the first SLs 1102 and the first BLs 1104.

Any suitable etching process may be used to from the IMD cavities 1302 such as, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 926. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

As shown in FIG. 13, the IMD cavities 1302 may be etched with an increasing width as the height of the IMD cavity 1302 increases in the Z-direction. In some embodiments, the upper portion of the IMD cavities 1302 may be exposed to more etchants in order to create the varying width. In such embodiments, the IMD cavities 1302 may have sidewalls at an angle greater than about 90 degrees to the top surface of the first SLs 1102 or the first BLs 1104. In some embodiments, the IMD cavities 1302 may have sidewalls at an angle equal to about 90 degrees to the top surface of the first SLs 1102 or the first BLs 1104.

In some embodiments, the IMD cavities 1302 may have a first sidewall portion, a plateau portion, and a second sidewall portion in an increasing height along the Z-direction. In such embodiments, the first sidewall portion may have an angle greater than about 90 degrees to the top surface of the first SLs 1102 or the first BLs 1104. In such embodiments, the plateau portion may be parallel to the top surface of the first SLs 1102 or the first BLs 1104. In such embodiments, the second sidewall portion may have an angle greater than about 90 degrees to the top surface of the first SLs 1102 or the first BLs 1104. The angle of the second sidewall portion may be the same as or different from the angle of the first sidewall portion. In some embodiments, the angle of the first sidewall portion may be equal to about 90 degrees. In some embodiments, the angle of the second sidewall portion may be equal to about 90 degrees.

In some embodiments, the IMD cavities 1302 may have a first sidewall portion and a second sidewall portion in an increasing height along the Z-direction without a plateau portion. In such embodiments, the first sidewall portion may have an angle greater than or equal to about 90 degrees to the top surface of the first SLs 1102 or the first BLs 1104. In such embodiments, the second sidewall portion may have an angle greater than or equal to about 90 degrees to the top surface of the first SLs 1102 or the first BLs 1104.

Figure 14:
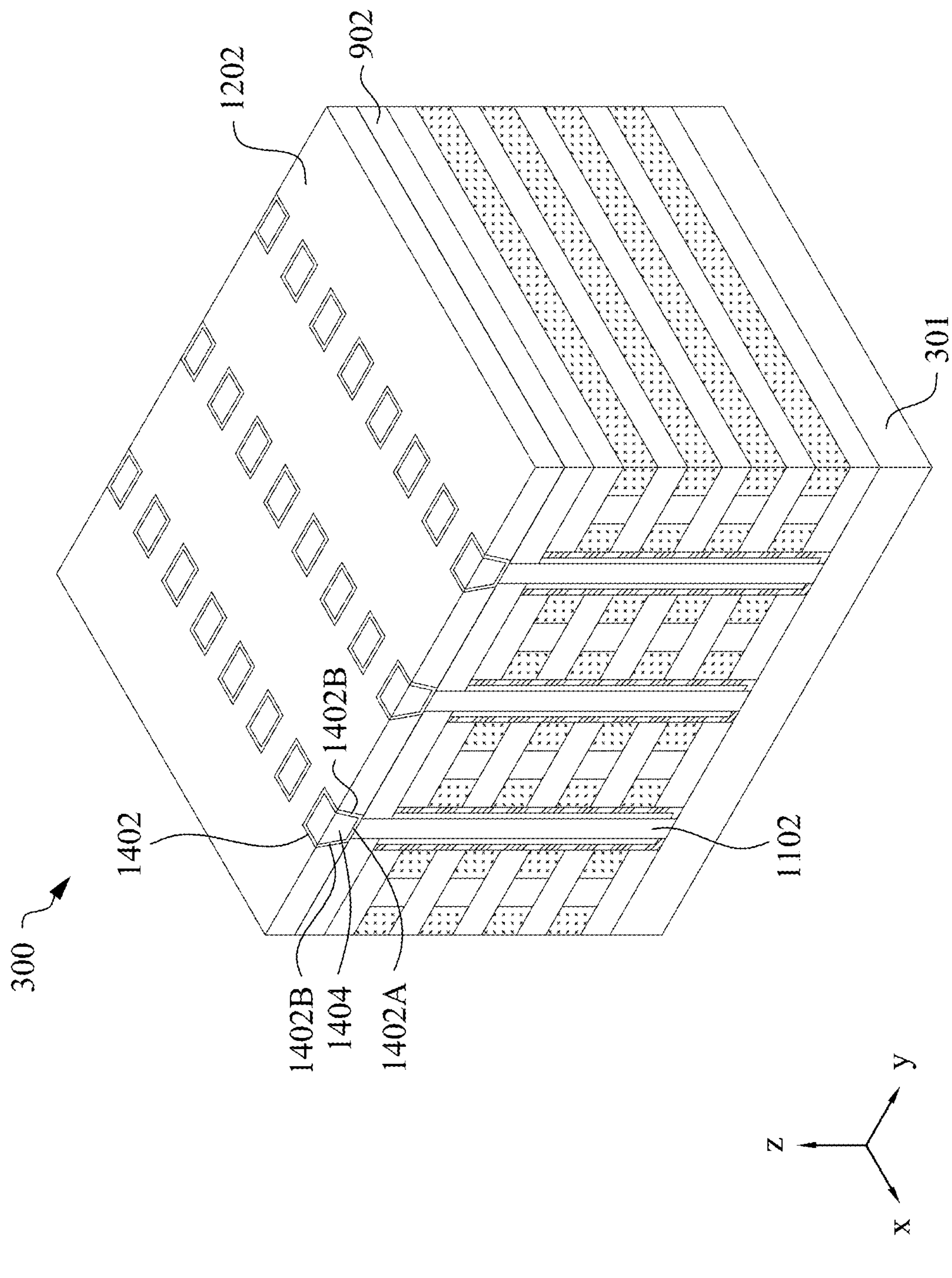

Corresponding to operation 222 of FIG. 2, FIG. 14 is a perspective view of the 3D memory device 300 including a plurality of bowl-shaped conductive structures 1402 and a plurality of insulating layers 1404 filling the interior of a corresponding of the bowl-shaped conductive structures 1402, at one of the various stages of fabrication, in accordance with some embodiments.

The plurality of bowl-shaped conductive structures 1402 may be formed in the IMD cavities 1302 (FIG. 13). The bowl-shaped conductive structures 1402 may be formed along the top surface of the exposed first SLs 1102 or the exposed first BLs 1104, and along the sidewalls of the IMD cavities 1302 (FIG. 13). The bowl-shaped conductive structures 1402 may be formed from a metallic fill materials. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof. A conformal coating may be deposited such that the bowl-shaped conductive structure 1402 is continuous on the sidewalls and bottom portion of the IMD cavities 1302 (FIG. 13).

As shown in in FIG. 14, in some embodiments, the bowl shape of the bowl-shaped conductive structure 1402 includes a base portion 1402A extending in a plane defined by the X-direction and the Y-direction. The bowl shape further includes at least one sidewall portion 1402B extending from the outer peripheral edges of the base portion 1402A and away from the first SLs 1102 or the first BLs 1104 at an angle to the top surface of the first SLs 1102 or the first BLs 1104 that is greater than or equal to 90 degrees.

After forming the bowl-shaped conductive structures 1402, an internal cavity of the IMD cavities 1302 (FIG. 13) may be at least partially filled with the insulating layer 1404. Each of the cavities is filled with an insulating material (e.g., $SiO_2$, SiN, SiON, SiCN, SiC, SiOC, SiOCN, the like, any other suitable material, or combinations thereof) so as to form the insulating layer 1404. In some embodiments, the insulating layer 1404 may be formed from the same material as the plurality of first insulating layers 304 (e.g., $SiO_2$). The insulating layer 1404 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

In some embodiments, a top surface of the insulating layer 1404 may be level with a top surface of the IMD layer 1202. A CMP process may be performed after forming the insulating layer 1404 so that it will lie in the same X-Y plane or are level with a top surface of the IMD layer 1202. In some embodiments, the top surface of the bowl-shaped insulating layer may be below or above the top surface of the IMD layer 1202.

Figure 15:
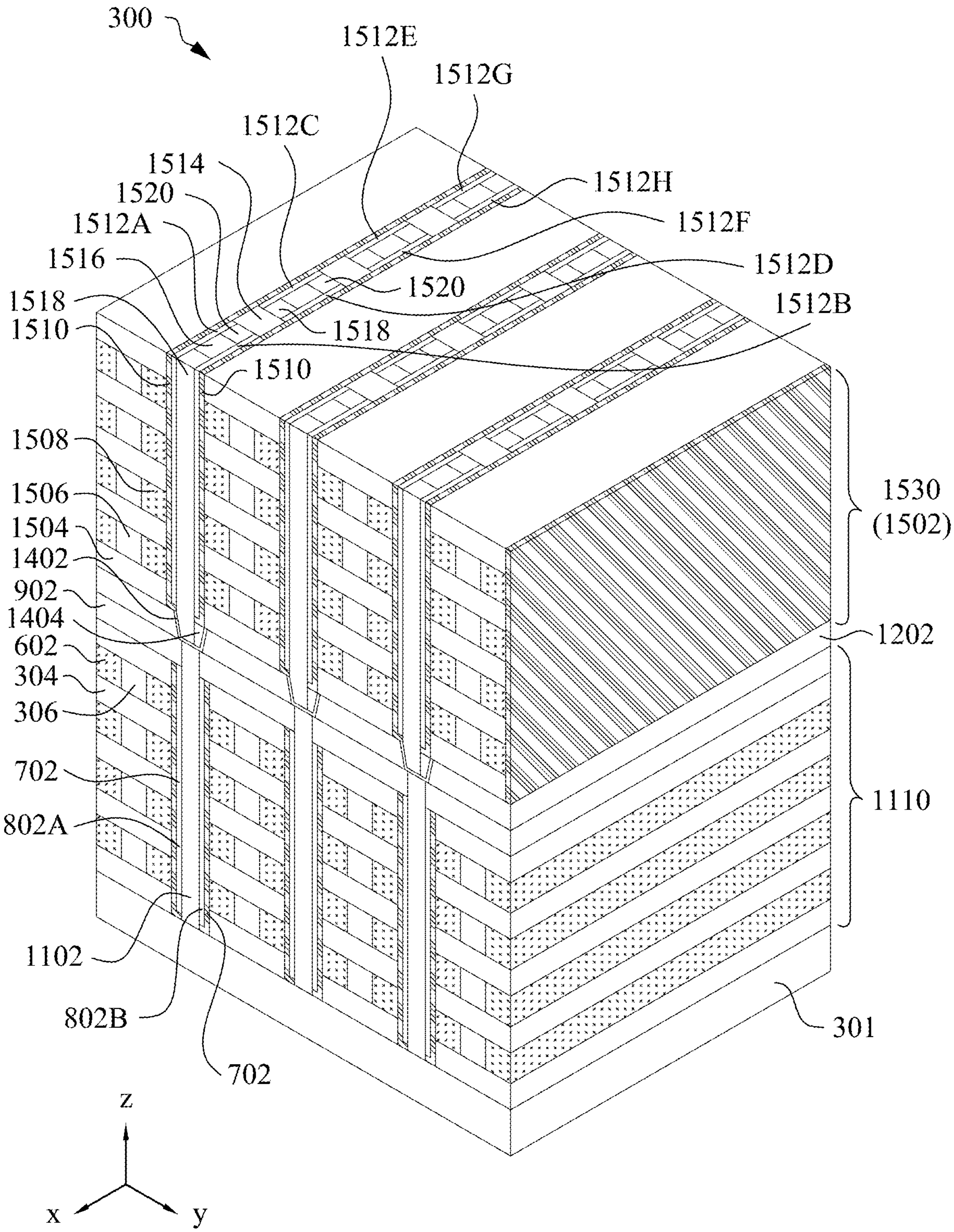
Figure 16:
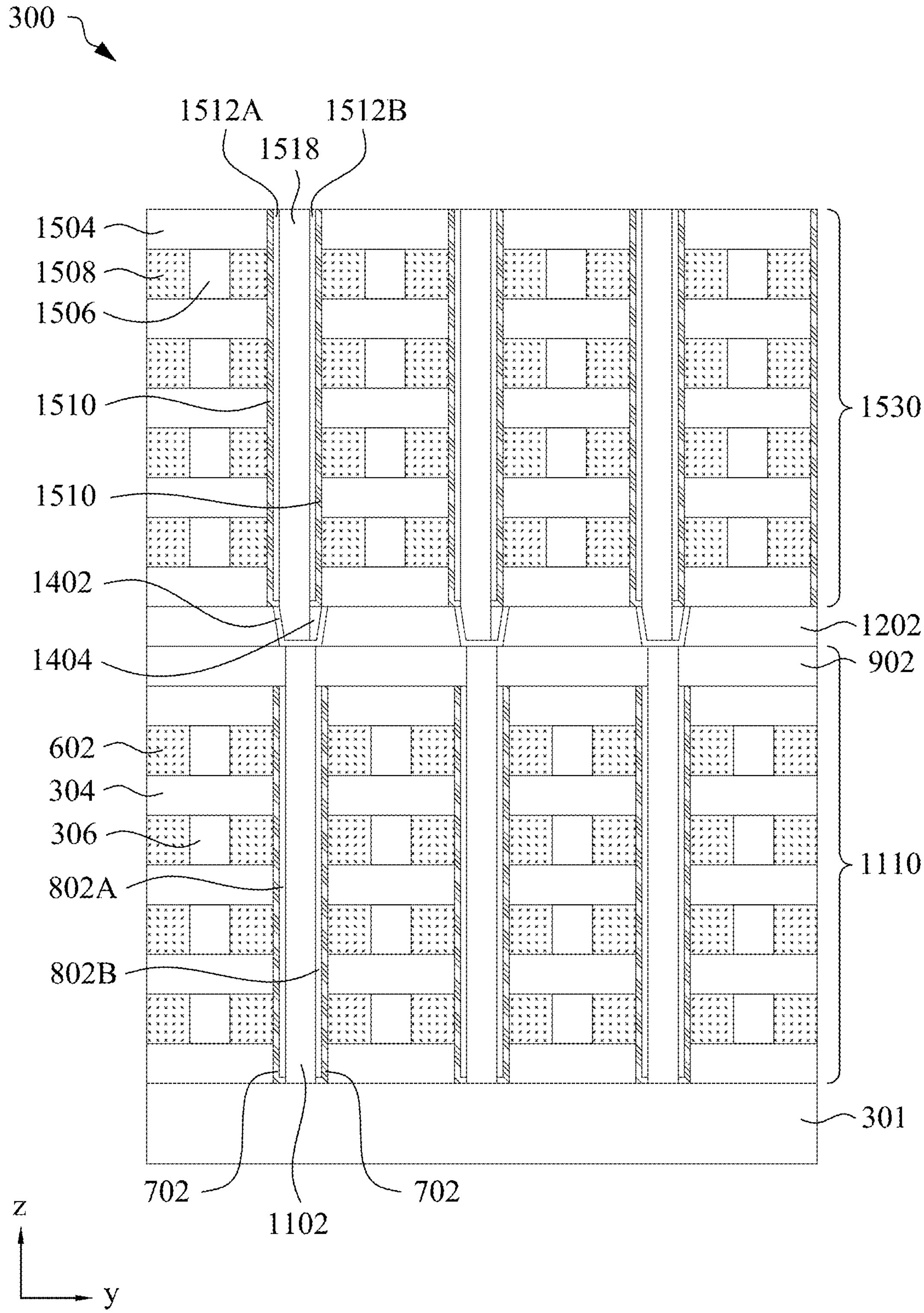
FIG. 16 illustrates a cross-sectional view of the example 3D memory device of FIG. 15, in accordance with some embodiments.

Corresponding to operations 224-234 of FIG. 2, FIGS. 15 and 16 are a perspective view and a cross-sectional view cut along the Y-direction, respectively, of the 3D memory device 300 including the second memory array 1530, in accordance with some embodiments.

It is noted that the operations 224-234 of FIG. 2 are substantially similar to the operations 204-212 and 214 of FIG. 2. At operation 224 (similar to operation 204), a second stack 1502 (similar to the first stack 302) is formed over the IMD layer 1202, the bowl-shaped conductive structures 1402, and the insulating layers 1404. The second stack 1502 includes a number of second insulating layers 1504 and a number of second sacrificial layers 1506 alternatively stacked on top of one another over the IMD layer 1202 along the Z-direction. At operation 226 (similar to operation 206), a second plurality of WL trenches (similar to the first WL trenches 402) are formed in the second stack 1502. At operation 228 (similar to operation 208, a plurality of second WLs 1508 (similar to the first WLs 602) are formed in cavities formed from etching portions of the second sacrificial layers 1506.

At operation 230 (similar to operation 210), second memory layers 1510 (similar to the first memory layers 702) and second semiconductor channel layers (similar to the first channel layers 704) are formed. A second inner spacer 1516 (similar to the first inner spacers 706) may be formed in the second WL trenches. At operation 232 (similar to operation 212), the second semiconductor channel layers are patterned to form a plurality of second channel films 1512A-H (similar to the first channel films 802A-H). Second isolation structures 1514 may be formed to separate the second channel films 1512A-H.

At operation 234 (similar to operation 216), second SLs 1518 (similar to the first SLs 1102) and second BLs 1520 (similar to the first BLs 1104) are formed. The second inner spacers 1516 may be patterned to define second vertical cavities of a number of second SLs and second BLs. The patterning generates trench portions by first etching through axial ends of the second inner spacers 1516 and the insulating layer 1404 to the bowl-shaped conductive structure 1402. The axial ends of the axial ends of the second inner spacers 1516 and the insulating layer 1404 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

The second SLs 1518 and the second BLs 1520 may then be formed, for example, using an epitaxial layer growth process to fill the trench portions with a continuously formed metal material such that the second SLs 1518 and the second BLs 1520 are located in the footprints, each extending from the bowl-shaped conductive structure 1402 to a top surface of the topmost second insulating layer 1504, as shown in FIG. 15. The second SLs 1518 and the second BLs 1520 may be formed in contact with end portions of a sidewall of the second semiconductor channels 1512A-H. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the second SLs 1518 and the second BLs 1520 may be formed with a continuously formed semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The second SLs 1518 and the second BLs 1520 can be formed by overlaying the workpiece (e.g., to fill the recesses) with the above-listed material by, for example, chemical vapor deposition (CVD), physical vapor deposition (PVD), electroless plating, electroplating, any other suitable material, or combinations thereof. In some embodiments, a control deposition step may be performed for forming the second SLs 1518 and the second BLs 1520 such that the deposition step is stopped when a height of the second SLs 1518 and the second BLs 1520 in the Z-direction are equal to a height of the second stack 1502. In other embodiments, a CMP operation may be performed after formation of the second SLs 1518 and the second BLs 1520 so as to ensure a top surface of the topmost second insulating layer 1504, the second memory layers 1510, the second semiconductor channel films 1512A-H, second SLs 1518, and the second BLs 1520 lie in the same X-Y plane or are level with a top surface of the topmost second insulating layer 1504. In other embodiments, a top surface of the second SLs 1518 and the second BLs 1520 may be higher than a top surface of the second insulating layer 1504. In some other embodiments, the top surface of the second SLs 1518 and the second BLs 1520 may be lower than the top surface of the second insulating layer 1504.

Upon forming the second SLs 1518 and the second BLs 1520, a number of second memory cells 1540 may be formed (or otherwise defined), in accordance with various embodiments. Each of the second SLs 1518 and the second BLs 1520 are in contact with a respective one of the plurality of second semiconductor channel films 1512A-H. Each of the second semiconductor channel films 1512A-H is (e.g., electrically) coupled to a portion of each of the second WLs 1508. Each second memory cell 1540 may be defined by such a portion of one of the second WLs 1508 (which can function as its gate terminal), a portion of one of the second semiconductor channel films 1512A-H, a portion of one of the second memory layers 1510, one of the second SLs 1518 (which can function as its source terminal), and one of the second BLs 1520 (which can function as its drain terminal). These second memory cells 1540, which share the same pair of second SL and BL (and the same second semiconductor channel film), may be vertically separated from one another to form a memory string 1550. Alternatively stated, these memory cells of a single memory string are disposed in respective different memory levels. As such, the memory cells of such a memory string have their respective gate terminals (WLs) disposed in those different memory levels. In addition, a plurality of these memory strings can be laterally disposed with respect to one another to form a second memory block or a second memory array 1530.

Figure 17:
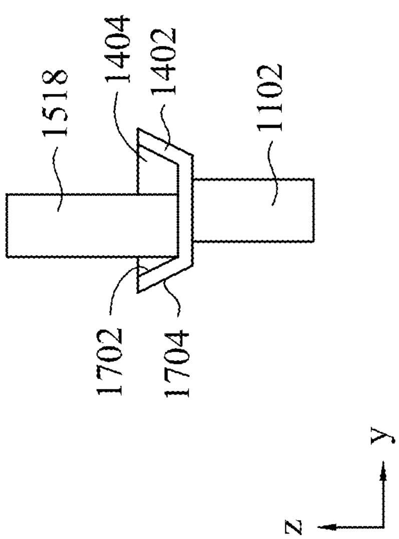
FIG. 17 illustrates a cross-sectional view of a portion of the example 3D memory device of FIG. 15, in accordance with some embodiments.

To further illustrate the first SLs 1102/the first BLs 1104, the bowl-shaped conductive structure 1402, and the second SLs 1518/the second BLs 1520, FIG. 17 illustrates a cross-sectional view taken along the Y-direction of a portion of the 3D memory device 300, in accordance with some embodiments.

FIG. 17 shows that the first SL 1102 and the second SL 1518 may be misaligned from each other along the Y-direction and/or the X-direction. The second SL 1518 may extend into the internal cavity formed by the bowl-shaped conductive structure 1402 and may contact an inner bottom surface 1702 of the bowl-shaped conductive structure 1402. The first SL 1102 may be disposed opposite to the internal cavity of the bowl-shaped conductive structure 1402 and may contact an exterior bottom surface 1704 of the bowl-shaped conductive structure 1402. The bowl-shaped conductive structure 1402 increases the effective (e.g., electrical) contact area between the first SL 1102 and the second SL 1518 in the case of such a misalignment. Therefore, contact resistance does not increase and the read current and the read speed of the memory device 300 are not negatively impacted by the misalignment. It is understood that although the first SL 1102 and the second SL 1518 are shown in FIG. 17, the bowl-shaped conductive structure 1402 may result in the same benefits when positioned between the first BL 1104 and the second BL 1520.

To further illustrate various embodiments of the bowl-shaped conductive structure 1402, FIGS. 18, 19, 20, and 21 illustrate cross-sectional views along the Y-direction of a portion of the 3D memory device 300 (FIG. 15) with various alignments of the first SL 1102 and the second SL 1518, in accordance with various embodiments.

FIGS. 18-21 illustrate the bowl-shaped conductive structure 1402 with a bottom base portion 1802A that extends in a first plane defined by the X-direction and the Y-direction; first sidewall portions 1802B that extend from the outer peripheral edges of the bottom base portion 1802A away from the first SL 1102 at a first angle to the top surface of the first SL 1102; intermediate base portions 1802C that extends in a second plane defined by the X-direction and the Y-direction; and second sidewall portions 1802D that extend from the outer peripheral edges of the intermediate base portion 1802C away from the first SL 1102 at a second angle to the top surface of the first SL 1102. In some embodiments, the first angle is greater than about 90 degrees. In some embodiments, the first angle is equal to about 90 degrees. In some embodiments, the second angle is greater than about 90 degrees. In some embodiments, the second angle is equal to about 90 degrees. The first angle and the second angle may be the same or different from each other. The bowl-shaped conductive structure 1402 may be formed in an IMD cavity 1302 (FIG. 13) with a corresponding shape.

Figure 18:
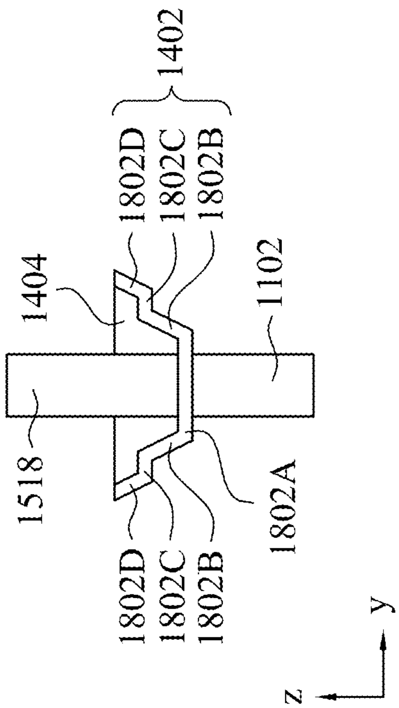
FIG. 18 illustrates a cross-sectional view of a portion of an example 3D memory device with aligned conductive structures, in accordance with some embodiments.
Figure 19:
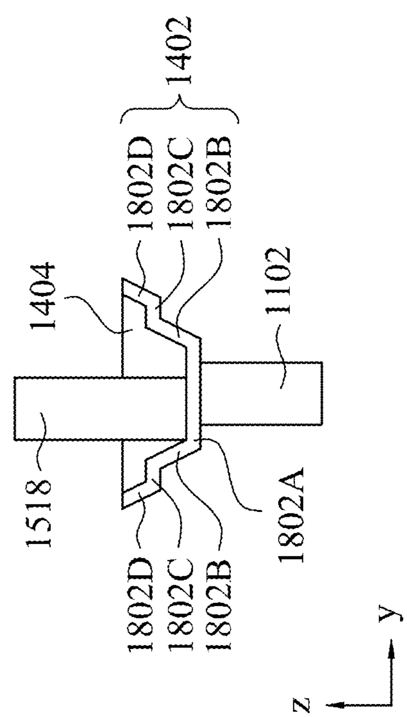
FIGS. 19, 20, and 21 illustrate cross-sectional views of a portion of an example 3D memory device with misaligned conductive structures, in accordance with some embodiments.
Figure 20:
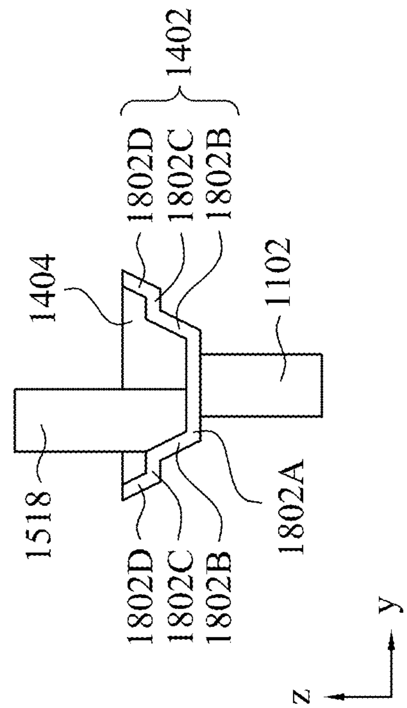
Figure 21:
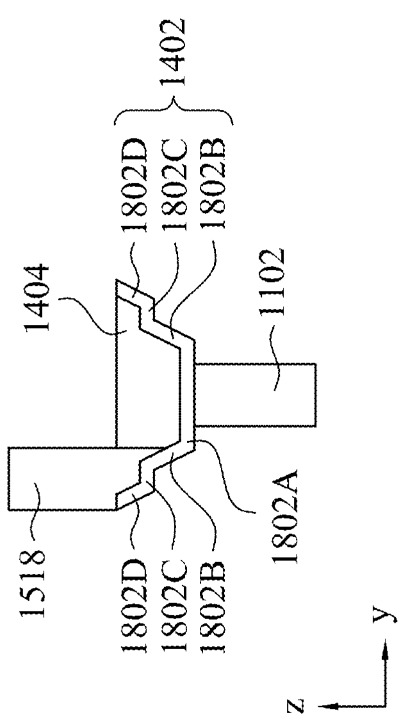

FIG. 18 illustrates that the first SL 1102 is aligned with the second SL 1518 along the vertical direction. FIGS. 19-21 illustrate various misalignments between the first SL 1102 and the second SL 1518. In FIG. 19, the second SL 1518 is slightly misaligned with the first SL 1102 but still fully in contact with the bottom base portion 1802A. In FIG. 20, the second SL 1518 is misaligned with the first SL 1102 and in contact with both the bottom base portion 1802A and a first sidewall portion 1802B. In FIG. 21, the second SL 1518 is misaligned with the first SL 1102 and in contact with the bottom base portion 1802A, the first sidewall portion 1802B, the intermediate base portion 1802C, and the second sidewall portion 1802D. In each case, despite the severity of misalignment between the first SL 1102 and the second SL 1518, both SLs are fully in contact with the bowl-shaped conductive structure 1402. Therefore, no contact area is lost between the first SL 1102 and the second SL 1518 and the contact resistance does not increase. It is understood that the bowl-shaped conductive structure 1402 in FIGS. 18-21 may also be interposed between the first BL 1104 and the second BL 1520.

To further illustrate various embodiments of the bowl-shaped conductive structure 1402, FIGS. 22, 23, 24, and 25 illustrate cross-sectional views along the Y-direction of a portion of the 3D memory device 300 (FIG. 15) with various alignments of the first SL 1102 and the second SL 1518, in accordance with various embodiments.

FIGS. 22-25 illustrate the bowl-shaped conductive structure 1402 with a bottom base portion 2202A that extends in a first plane defined by the X-direction and the Y-direction; first sidewall portions 2202B that extend from the outer peripheral edges of the base portion away from the first SL 1102 at a first angle to the top surface of the first SLs 1102; and second sidewall portions 2202C that extend from the outer peripheral edges of the first sidewall portions 2202B. In some embodiments, the first angle is greater than about 90 degrees. In some embodiments, the second angle is equal to about 90 degrees. The bowl-shaped conductive structure 1402 may be formed in an IMD cavity 1302 (FIG. 13) with a corresponding shape.

Figure 22:
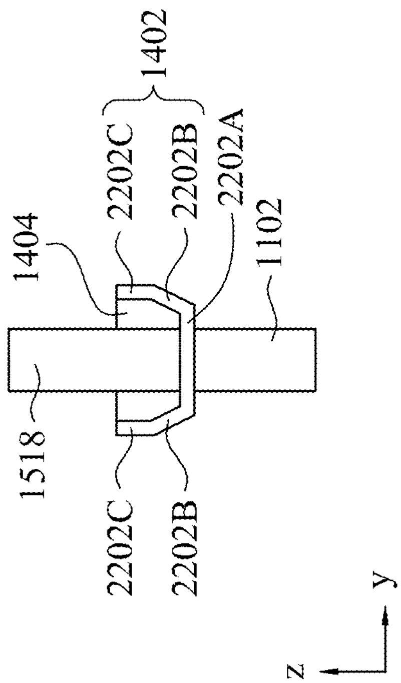
FIG. 22 illustrates a cross-sectional view of a portion of an example 3D memory device with aligned conductive structures, in accordance with some embodiments.
Figure 23:
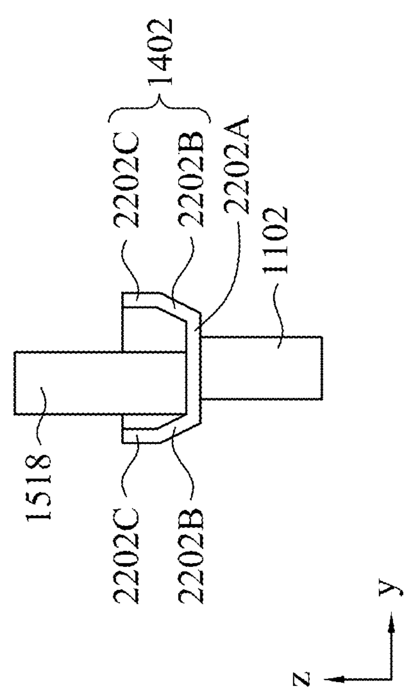
FIGS. 23, 24, and 25 illustrate cross-sectional views of a portion of an example 3D memory device with misaligned conductive structures, in accordance with some embodiments.
Figure 24:
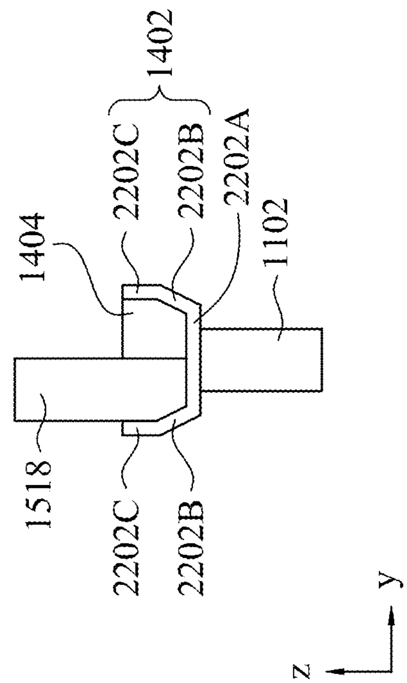
Figure 25:
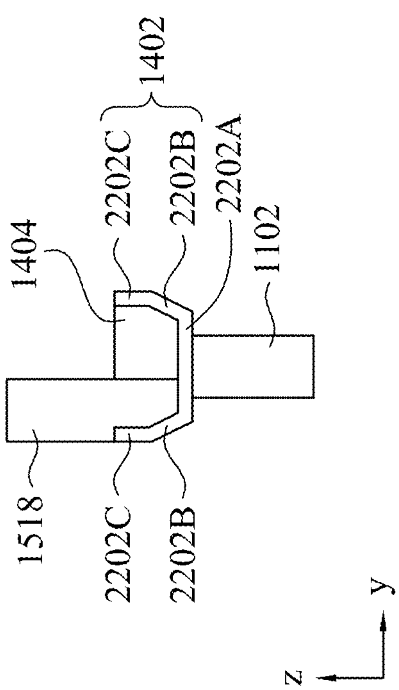

FIG. 22 illustrates that the first SL 1102 is aligned with the second SL 1518 along the vertical direction. FIGS. 23-25 illustrate various misalignments between the first SL 1102 and the second SL 1518. In FIG. 23, the second SL 1518 is slightly misaligned with the first SL 1102 but still fully in contact with the bottom base portion 2202A. In FIG. 24, the second SL 1518 is misaligned with the first SL 1102 and in contact with both the bottom base portion 2202A, a first sidewall portion 2202B, and a second sidewall portion 2202C. In FIG. 25, the second SL 1518 is misaligned with the first SL 1102 and in contact with the bottom base portion 2202A, the first sidewall portion 2202B, and the second sidewall portion 2202C. In each case, despite the severity of misalignment between the first SL 1102 and the second SL 1518, both SLs are fully in contact with the bowl-shaped conductive structure 1402. Therefore, no contact area is lost between the first SL 1102 and the second SL 1518 and the contact resistance does not increase. It is understood that the bowl-shaped conductive structure 1402 in FIGS. 22-25 may also be interposed between the first BL 1104 and the second BL 1520.

To further illustrate various embodiments of the bowl-shaped conductive structure 1402, FIGS. 26, 27, 28, and 29 illustrate cross-sectional views along the Y-direction of a portion of the 3D memory device 300 (FIG. 15) with various alignments of the first SL 1102 and the second SL 1518, in accordance with various embodiments.

FIGS. 26-29 illustrate the bowl-shaped conductive structure 1402 with a bottom base portion 2602A that extends in a first plane defined by the X-direction and the Y-direction; first sidewall portions 2602B that extend from the outer peripheral edges of the bottom base portion 2602A away from the first SL 1102 at a first angle to the top surface of the first SL 1102; and second sidewall portions 2602C that extend from the outer peripheral edges of the first sidewall portions 2602B. In some embodiments, the first angle is equal to about 90 degrees. In some embodiments, the second angle is greater than about 90 degrees. The bowl-shaped conductive structure 1402 may be formed in an IMD cavity 1302 (FIG. 13) with a corresponding shape.

Figure 26:
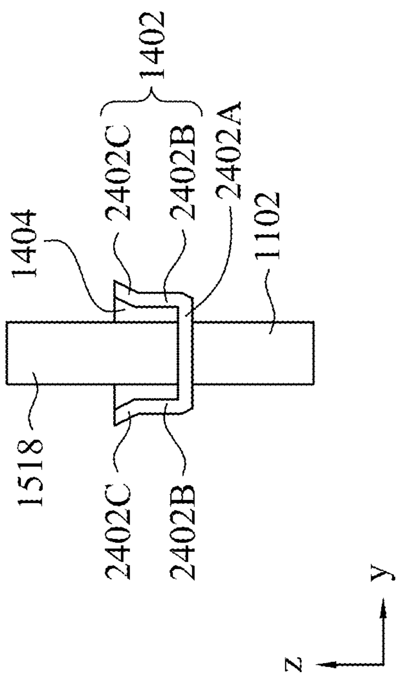
FIG. 26 illustrates a cross-sectional view of a portion of an example 3D memory device with aligned conductive structures, in accordance with some embodiments.
Figure 28:
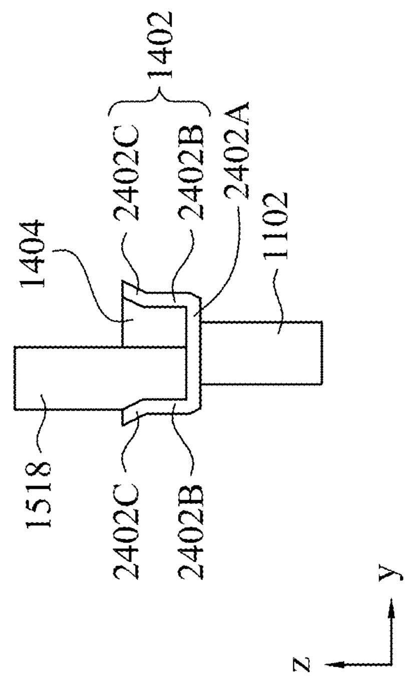
FIGS. 27, 28, and 29 illustrate cross-sectional views of a portion of an example 3D memory device with misaligned conductive structures, in accordance with some embodiments.
Figure 27:
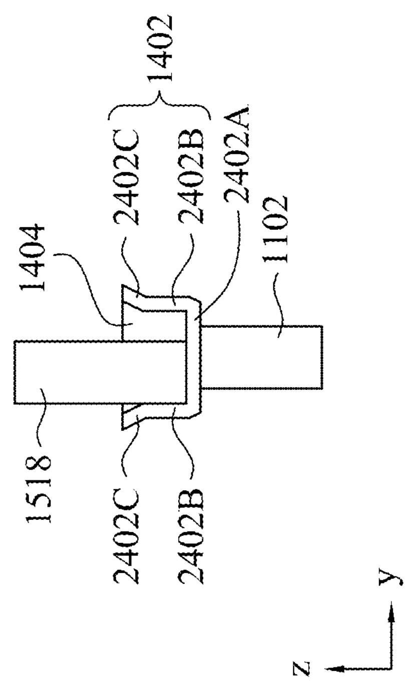
Figure 29:
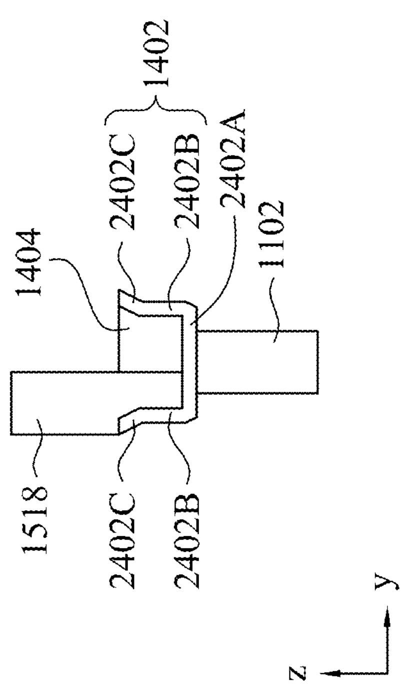

FIG. 26 illustrates that the first SL 1102 is aligned with the second SL 1518 along the vertical direction. FIGS. 27-29 illustrate various misalignments between the first SL 1102 and the second SL 1518. In FIG. 27, the second SL 1518 is slightly misaligned with the first SL 1102 but still fully in contact with the bottom base portion 2602A and a first sidewall portion 2602B. In FIG. 28, the second SL 1518 is misaligned with the first SL 1102 and in contact with both the bottom base portion 2602A, a first sidewall portion 2602B, and a second sidewall portion 2602C. In FIG. 29, the second SL 1518 is misaligned with the first SL 1102 and in contact with the bottom base portion 2602A, the first sidewall portion 2602B, and the second sidewall portion 2602C. In each case, despite the severity of misalignment between the first SL 1102 and the second SL 1518, both SLs are fully in contact with the bowl-shaped conductive structure 1402. Therefore, no contact area is lost between the first SL 1102 and the second SL 1518 and the contact resistance does not increase. It is understood that the bowl-shaped conductive structure 1402 in FIGS. 18-21 may also be interposed between the first BL 1104 and the second BL 1520.

Figure 30:
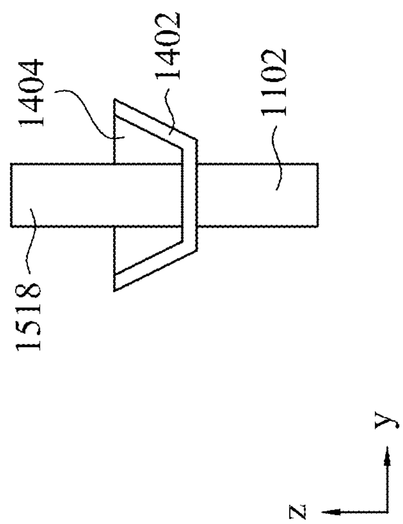
FIG. 30 illustrates a cross-sectional view of a portion of an example 3D memory device, in accordance with some embodiments.
Figure 31:
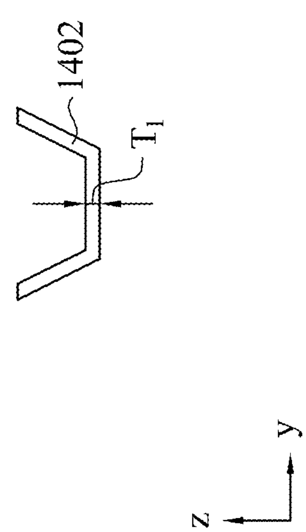
FIG. 31 illustrates a cross-sectional view of a bowl-shaped conductive structure from the example 3D memory device of FIG. 30, in accordance with some embodiments.

To further illustrate various embodiments of the bowl-shaped conductive structures, FIGS. 30 and 31 illustrate cross-sectional views along the Y-direction of a portion of the 3D memory device 300 (FIG. 15).

FIG. 30 illustrates the cross-sectional view of the 3D memory device 300 with the first SL 1102, the second SL 1518, the bowl-shaped conductive structure 1402, and the insulating layer 1404. FIG. 31 illustrates just the bowl-shaped conductive structure 1402 with a thickness of $T_1$.

Figure 32:
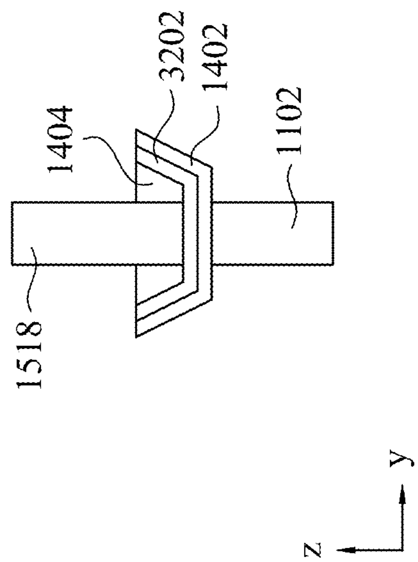
FIG. 32 illustrates a cross-sectional view of a portion of an example 3D memory device, in accordance with some embodiments.
Figure 33:
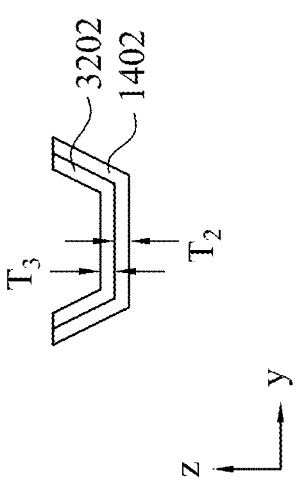
FIG. 33 illustrates a cross-sectional view of two bowl-shaped conductive structures from the example 3D memory device of FIG. 32, in accordance with some embodiments.

To further illustrate various embodiments of the bowl-shaped conductive structures, FIGS. 32 and 33 illustrate cross-sectional views along the Y-direction of a portion of the 3D memory device 300 (FIG. 15) with a bowl-shaped conductive structure 1402 and a second bowl shaped conductive structure 3202.

FIG. 32 illustrates the cross-sectional view of the 3D memory device 300 with the first SL 1102, the second SL 1518, the bowl-shaped conductive structure 1402, the second bowl-shaped conductive structure 3202, and the insulating layer 1404. The second bowl-shaped conductive structure 3202 may also be formed from a metallic fill material including at least one metal material selected from the group consisting of tungsten, copper, cobalt, ruthenium, titanium, tantalum, any other suitable material, or combinations thereof. The second bowl-shaped conductive structure 3202 may be a different metallic material than the bowl-shaped conductive structure 1402. The metallic fill material can be deposited by a conformal deposition method, which can be, for example, chemical vapor deposition (CVD), atomic layer deposition (ALD), electroless plating, electroplating, any other suitable method, or a combination thereof. A conformal coating may be deposited such that the second bowl-shaped conductive structure 3202 is continuous on the bowl-shaped conductive structure 1402. FIG. 33 illustrates the bowl-shaped conductive structure 1402 with a thickness of $T_2$ and the second bowl-shaped conductive structure 3202 with a thickness of $T_3$. The thicknesses $T_2$ and $T_3$ may be the same as or different from each other. In some embodiments, the thicknesses $T_2$ and $T_3$ summed together may equal about the thickness $T_1$ (FIG. 31).

Figure 34:
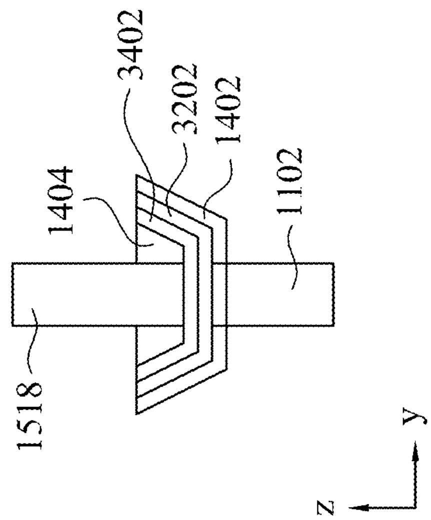
FIG. 34 illustrates a cross-sectional view of a portion of an example 3D memory device, in accordance with some embodiments.
Figure 35:
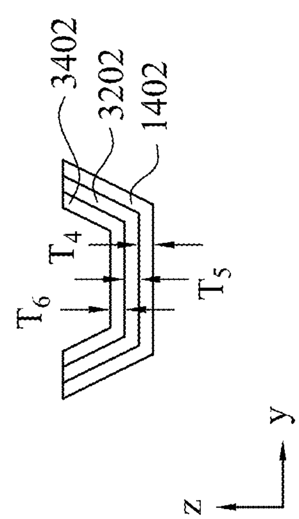
FIG. 35 illustrates a cross-sectional view of a three bowl-shaped conductive structures from the example 3D memory device of FIG. 34, in accordance with some embodiments.

To further illustrate various embodiments of the bowl-shaped conductive structures, FIGS. 34 and 35 illustrate cross-sectional views along the Y-direction of a portion of the 3D memory device 300 (FIG. 15) with the bowl-shaped conductive structure 1402, the second bowl-shaped conductive structure 3202, and a third bowl-shaped conductive structure 3402.

FIG. 34 illustrates the cross-sectional view of the 3D memory device 300 with the first SL 1102, the second SL 1518, the bowl-shaped conductive structure 1402, the second bowl-shaped conductive structure 3202, the third bowl-shaped conductive structure 3402, and the insulating layer 1404. The third bowl-shaped conductive structure 3402 may also be formed from a metallic fill material including at least one metal material selected from the group consisting of tungsten, copper, cobalt, ruthenium, titanium, tantalum, any other suitable material, or combinations thereof. The third bowl-shaped conductive structure 3402 may be a different metallic material than the bowl-shaped conductive structure 1402 and the second bowl-shaped conductive structure. The metallic fill material can be deposited by a conformal deposition method, which can be, for example, chemical vapor deposition (CVD), atomic layer deposition (ALD), electroless plating, electroplating, any other suitable method, or a combination thereof. A conformal coating may be deposited such that the third bowl-shaped conductive structure 3402 is continuous on the second bowl-shaped conductive structure 3202. FIG. 33 illustrates the bowl-shaped conductive structure 1402 with a thickness of $T_4$, the second bowl-shaped conductive structure 3202 with a thickness of $T_5$, and the third bowl-shaped conductive structure 3402 with a thickness of $T_6$. The thicknesses $T_4$, $T_5$, and $T_6$ may be the same as or different from each other. In some embodiments, the thicknesses $T_4$, $T_5$, and $T_6$ summed together may equal about the thickness $T_1$ (FIG. 31). It is understood that the number of bowl-shaped conductive structures is not limited to three and can be any suitable number (e.g., 4, 5, 6, 7, etc.).

In one aspect of the present disclosure, a semiconductor device is disclosed. The semiconductor device includes a first memory array which includes a first memory string including a plurality of first memory cells arranged in a vertical direction. The first memory array further includes a first conductive structure operatively coupled to the first memory string that extends through the first memory array in the vertical direction. The semiconductor device further includes a second memory array including a second memory string including a plurality of second memory cells arranged in the vertical direction. The second memory array further includes a second conductive structure operatively coupled to the second memory string that extends through the second memory array in the vertical direction. The semiconductor device further includes a bowl-shaped conductive structure interposed between the first and second memory arrays, and configured to operatively couple the first conductive structure to the second conductive structure.

In another aspect of the present disclosure, a memory device is disclosed. The memory device includes a dielectric layer and a plurality of first conductive structures formed through the dielectric layer. Each of the plurality of first conductive structures has a bowl structure and defines an inner cavity. The memory device may further include a plurality of second conductive structures extending along a vertical direction and disposed below the dielectric layer. The memory device may further include a plurality of third conductive structures extending along the vertical direction and disposed above the dielectric layer. Each first conductive structure is electrically coupled to a corresponding one of the plurality of second conductive structures and a corresponding one of the plurality of third conductive structures. The third conductive structure extends into the internal cavity.

In yet another aspect of the present disclosure, a method for fabricating memory devices is disclosed. The method includes forming a first memory array comprising a plurality of first memory strings and forming a plurality of first conductive structures vertically extending through the first memory array. Each of the first conductive structures are electrically coupled to a corresponding one of the plurality of first memory strings. The method further includes forming a plurality of second conductive structures having a bowl shape with an exterior bottom surface in contact with a corresponding one of the plurality of first conductive structures. The method further includes forming a second memory array over the first memory array. The second memory array includes a plurality of second memory strings. The method further includes forming a plurality of third conductive structures vertically extending through the second memory array. Each of the second conductive structures is electrically coupled to a corresponding one of the plurality of second memory strings and in contact with at least an interior bottom surface of the bowl shape of a corresponding one of the second conductive structures.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first memory array comprising a plurality of first memory strings;

forming a plurality of first conductive structures vertically extending through the first memory array, each of the first conductive structures electrically coupled to a corresponding one of the plurality of first memory strings;

forming a plurality of second conductive structures over the first memory array, each of the plurality of second conductive structures having a bowl shape with an exterior bottom surface in contact with a corresponding one of the plurality of first conductive structures;

forming a second memory array over the first memory array, the second memory array comprising a plurality of second memory strings; and forming a plurality of third conductive structures vertically extending through the second memory array, each of the second conductive structures electrically coupled to a corresponding one of the plurality of second memory strings and in contact with at least an interior bottom surface of the bowl shape of a corresponding one of the second conductive structures.

2. The method of claim 1, wherein the step of forming a plurality of second conductive structures further comprises:

forming a dielectric layer over the first memory array; and patterning the dielectric layer to form a plurality of recesses that expose top surfaces of the plurality of first conductive structures, respectively.

3. The method of claim 2, wherein the step of forming a plurality of second conductive structures further comprises:

lining the plurality of recesses with one or more metal layers to form the plurality of second conductive structures, respectively; and filling remaining portions of the plurality of recesses with an insulating material.

4. The method of claim 2, wherein each of the plurality of recesses has a width varying along a vertical direction.

5. The method of claim 4, wherein the width increases along the vertical direction away from the first memory array.

6. The method of claim 1, wherein the bowl shape comprises:

a base portion extending in a plane defined by a first lateral direction and a second lateral direction; and sidewall portions extending from outer peripheral edges of the base portion and tilted away from the base portion with an angle.

7. The method of claim 6, wherein the angle is greater than 90 degrees.

8. The method of claim 1, wherein the bowl shape defines an internal cavity at least partially filled with an insulating material.

9. The method of claim 8, wherein the third conductive structure extends into the internal cavity to contact the interior bottom surface, and the first conductive structure contacts the exterior bottom surface.

10. A method, comprising:

forming a first memory array comprising a plurality of first conductive structures extending along a vertical direction, each of the first conductive structures electrically coupled to a plurality of first memory cells;

forming a plurality of second conductive structures over the first memory array, each of the plurality of second conductive structures having a bowl shape; and forming, over the second conductive structures, a second memory array comprising a plurality of third conductive structures along the vertical direction, each of the third conductive structures electrically coupled to a plurality of second memory cells;

wherein the bowl shape of each of the second conductive structures has an exterior bottom surface in contact with a corresponding one of the plurality of first conductive structures and an interior bottom surface in contact with a corresponding one of the plurality of third conductive structures.

11. The method of claim 10, wherein the first memory cells are arranged in the vertical direction, and the second memory cells are arranged in the vertical direction.

12. The method of claim 10, wherein the step of forming a plurality of second conductive structures further comprises:

forming a dielectric layer over the first memory array; and patterning the dielectric layer to form a plurality of recesses exposing top surfaces of the plurality of first conductive structures, respectively.

13. The method of claim 12, wherein the step of forming a plurality of second conductive structures further comprises:

lining the plurality of recesses with one or more metal layers to form the plurality of second conductive structures, respectively; and filling remaining portions of the plurality of recesses with an insulating material.

14. The method of claim 13, wherein the third conductive structure extends through the insulating material to contact the interior bottom surface.

15. The method of claim 10, wherein the bowl shape comprises:

a base portion extending in a plane defined by a first lateral direction and a second lateral direction; and sidewall portions extending from outer peripheral edges of the base portion and tilted away from the base portion with an angle.

16. The method of claim 15, wherein the angle is greater than 90 degrees.

17. The method of claim 10, wherein the step of forming a first memory array comprises forming a plurality of fourth conductive structures extending along a lateral direction and spaced from one another along the vertical direction, the fourth conductive structures corresponding to the plurality of first memory cells, respectively; and wherein the step of forming a second memory array comprises forming a plurality of fifth conductive structures extending along the lateral direction and spaced from one another along the vertical direction, the fifth conductive structures corresponding to the plurality of second memory cells, respectively.

18. A method, comprising:

forming a first memory array comprising a plurality of first source lines and a plurality of first bit lines extending along a vertical direction;

forming a plurality of bowl-shaped conductive structure over the first memory array; and forming, over the plurality of bowl-shaped conductive structures, a second memory array comprising a plurality of second source lines and a plurality of second bit lines extending along the vertical direction;

wherein the plurality of bowl-shaped conductive structures each have an exterior bottom surface in contact with a corresponding one of the plurality of first source lines or bit lines, and an interior bottom surface in contact with a corresponding one of the plurality of second source lines or bit lines.

19. The method of claim 18, wherein the plurality of bowl-shaped conductive structures each comprise:

a base portion extending in a plane defined by a first lateral direction and a second lateral direction; and sidewall portions extending from outer peripheral edges of the base portion and tilted away from the base portion with an angle.

20. The method of claim 19, wherein the angle is greater than 90 degrees.

* * * * *